US009238351B2

(12) United States Patent
Kagawa et al.

(10) Patent No.: US 9,238,351 B2
(45) Date of Patent: Jan. 19, 2016

(54) COMPOSITE FILM OF LINEARLY-SCRATCHED, THIN METAL FILM AND PLASTIC FILM, AND ITS PRODUCTION APPARATUS

(75) Inventors: Seiji Kagawa, Koshigaya (JP); Yoichiro Kagawa, Koshigaya (JP)

(73) Assignee: Kagawa Seiji, Koshigaya-Shi (JP)

( * ) Notice: Subject to any disclaimer, the term of this patent is extended or adjusted under 35 U.S.C. 154(b) by 795 days.

(21) Appl. No.: 12/922,089

(22) PCT Filed: Feb. 12, 2010

(86) PCT No.: PCT/JP2010/052106
§ 371 (c)(1),
(2), (4) Date: Sep. 10, 2010

(87) PCT Pub. No.: WO2010/093027
PCT Pub. Date: Aug. 19, 2010

(65) Prior Publication Data
US 2011/0008580 A1 Jan. 13, 2011

(30) Foreign Application Priority Data

Feb. 13, 2009 (JP) ................................. 2009-032070
Oct. 30, 2009 (JP) ................................. 2009-250843

(51) Int. Cl.
*B32B 3/30* (2006.01)
*B26D 3/06* (2006.01)
(Continued)

(52) U.S. Cl.
CPC ................ *B32B 15/08* (2013.01); *H01Q 17/00* (2013.01); *H05K 9/0086* (2013.01); *Y10T 83/0304* (2015.04); *Y10T 428/2457* (2015.01)

(58) Field of Classification Search
USPC ............................................ 428/167; 83/875
See application file for complete search history.

(56) References Cited

U.S. PATENT DOCUMENTS 5,289,077 A * 2/1994 Ugajin .................. H01J 21/105
313/308
5,764,518 A * 6/1998 Collins .................. B25J 9/1617
700/117

(Continued)

FOREIGN PATENT DOCUMENTS

CN 1668783 A 9/2005
EP 1388836 A1 2/2004
(Continued)

OTHER PUBLICATIONS

Chinese Office Action, dated Jun. 9, 2013, for Chinese Application No. 201080001708.9.
(Continued)

Primary Examiner — Tahseen N Khan
(74) Attorney, Agent, or Firm — Birch, Stewart, Kolasch & Birch, LLP

(57) ABSTRACT

The present invention provides a composite film having a linearly-scratched, thin metal film and a plastic film, which has good absorbability to electromagnetic waves in various frequencies, as well as reduced anisotropy in electromagnetic wave absorbability, suitable for electromagnetic wave absorbers, and its production apparatus. The composite film having a linearly-scratched, thin metal film and a plastic film according to the present invention comprises a plastic film, and a single- or multi-layer, thin metal film formed on at least one surface of the plastic film, the thin metal film being provided with large numbers of substantially parallel, intermittent, linear scratches with irregular widths and intervals in plural directions. Its production apparatus comprises pluralities of pattern rolls each having large numbers of fine, high-hardness particles on the surface, which are arranged to form linear scratches on the thin metal film side of a thin metal film-plastic composite film, and means each pressing the pattern roll to the composite film, and pluralities of the pattern rolls being oriented in different directions in a plane in which they are in sliding contact with the thin metal film of the composite film.

3 Claims, 20 Drawing Sheets

(51) Int. Cl.
*B32B 15/08* (2006.01)
*H01Q 17/00* (2006.01)
*H05K 9/00* (2006.01)

(56) References Cited

U.S. PATENT DOCUMENTS

| | | | |
|---|---|---|---|
| 5,855,988 A * | 1/1999 | Matsuo | 428/195.1 |
| 6,486,017 B1 * | 11/2002 | Verma | H01L 27/08 |
| | | | 257/E21.022 |
| 7,749,620 B2 | 7/2010 | Yoshida et al. | |
| 2001/0055879 A1 * | 12/2001 | Sasaki | G11B 5/3116 |
| | | | 438/689 |
| 2002/0025677 A1 * | 2/2002 | Uchiyama | C23F 4/00 |
| | | | 438/689 |
| 2003/0164243 A1 | 9/2003 | Arakawa et al. | |
| 2004/0140516 A1 | 7/2004 | Yoshikawa et al. | |
| 2005/0233102 A1 | 10/2005 | Kagawa et al. | |
| 2006/0057405 A1 * | 3/2006 | Kagawa | 428/458 |
| 2006/0075417 A1 * | 4/2006 | Miyanishi | G11B 5/1278 |
| | | | 720/658 |
| 2006/0115636 A1 | 6/2006 | Yoshida et al. | |
| 2007/0190296 A1 | 8/2007 | Yoshikawa et al. | |
| 2011/0031008 A1 * | 2/2011 | Kagawa | 174/377 |

FOREIGN PATENT DOCUMENTS

| | | |
|---|---|---|
| JP | 9-148782 A | 6/1997 |
| JP | 11-40980 A | 2/1999 |
| JP | 2000-286594 A | 10/2000 |
| JP | 2009-176827 A | 8/2009 |
| WO | WO 2009/157544 A1 | 12/2009 |
| WO | WO 2009157544 A1 * | 12/2009 |

OTHER PUBLICATIONS

Extended European Search Report, dated Sep. 6, 2013, for European Application No. 10741304.9.

* cited by examiner

COMPOSITE FILM OF LINEARLY-SCRATCHED, THIN METAL FILM AND PLASTIC FILM, AND ITS PRODUCTION APPARATUS

FIELD OF THE INVENTION

The present invention relates to a composite film having a linearly-scratched thin metal film and a plastic film for having low anisotropy of electromagnetic wave absorbability, which is suitable for an electromagnetic wave absorber, and its production apparatus.

BACKGROUND OF THE INVENTION

Electromagnetic wave absorbers for preventing the leak and intrusion of electromagnetic waves are used in electronic and communications apparatuses and systems such as personal computers, cell phones, automatic toll-collecting systems (ETC) on toll roads, wireless LAN, etc. Electromagnetic wave absorbers are required to efficiently absorb electromagnetic waves in a wide frequency range, with little difference in electromagnetic wave absorbability depending on incident directions (anisotropy of electromagnetic wave absorbability). Further, in systems using circularly polarized electromagnetic waves such as ETC, etc., electromagnetic wave absorbers are required to efficiently absorb both of TE waves (electromagnetic waves whose electric field components are perpendicular to an incident surface) and TM waves (electromagnetic waves whose magnetic field components are perpendicular to an incident surface).

Though electromagnetic wave absorbers formed by metal sheets or nets are widely used at present, electromagnetic wave-absorbing sheets having vapor-deposited metal layers formed on plastic sheets were recently proposed. For instance, JP 9-148782 A proposes an electromagnetic wave-absorbing sheet comprising a plastic film, and first and second vapor-deposited aluminum layers formed on both surfaces thereof, the first vapor-deposited aluminum layer being etched to a non-conductive linear pattern, and the second vapor-deposited aluminum layer being etched to a network conductive pattern. However, this electromagnetic wave-absorbing sheet has a periodic linear pattern and a periodic network pattern, it cannot efficiently absorb electromagnetic waves in a wide frequency range, and its electromagnetic wave absorbability has large anisotropy.

JP 11-40980 A proposes a electromagnetic wave shield having a vapor-deposited copper layer and a vapor-deposited nickel layer formed in this order on one surface of a plastic film. However, this electromagnetic wave shield has insufficient electromagnetic wave absorbability with large anisotropy.

OBJECT OF THE INVENTION

Accordingly, an object of the present invention is to provide a composite film having a linearly-scratched, thin metal film and a plastic film for having not only good absorbability to electromagnetic waves in various frequencies, but also low anisotropy of electromagnetic wave absorbability, so that it is suitable for electromagnetic wave absorbers, and an apparatus for producing it.

DISCLOSURE OF THE INVENTION

As a result of intensive research in view of the above object, the inventor has found that (a) the formation of large numbers of substantially parallel, intermittent, linear scratches with irregular widths and intervals in plural directions on a thin metal film formed on a plastic film produces a composite film having a linearly-scratched, thin metal film and a plastic film having not only good absorbability to electromagnetic waves in various frequencies, but also low anisotropy of electromagnetic wave absorbability, and that (b) such composite film having a linearly-scratched, thin metal film and a plastic film can be produced by an apparatus comprising pluralities of pattern rolls each having large numbers of fine, high-hardness particles on the surface with different axial directions. The present invention has been completed based on such finding.

Thus, the composite film having a linearly-scratched, thin metal film and a plastic film for reduced anisotropy of electromagnetic wave absorbability according to the present invention comprises a plastic film, and a single- or multi-layer, thin metal film formed on at least one surface of the plastic film, the thin metal film being provided with large numbers of substantially parallel, intermittent, linear scratches with irregular widths and intervals in plural directions. The thin metal film is preferably made of aluminum, copper, nickel or their alloys.

The linear scratches preferably have widths, 90% or more of which are in a range of 0.1-1,000 μm, and an average width of 1-100 μm. The linear scratches preferably have intervals in a range from 0.1 μm to 5 mm, and an average interval of 1-100 μm. The linear scratches are preferably oriented in at least two directions with crossing angles of 10-90°.

The apparatus of the present invention for producing the above composite film having a linearly-scratched, thin metal film and a plastic film comprises pluralities of pattern rolls each having large numbers of fine, high-hardness particles on the surface, which are arranged to form linear scratches on a thin metal film of a thin metal film-plastic composite film, and means for pushing the composite film to the pattern rolls, pluralities of the pattern rolls being oriented in different directions in a plane in which they are in sliding contact with the thin metal film of the composite film, whereby the thin metal film is successively brought into sliding contact with pluralities of the pattern rolls to form large numbers of substantially parallel, intermittent, linear scratches in plural directions on the thin metal film.

The apparatus for producing a composite film having a linearly-scratched, thin metal film and a plastic film according to one embodiment of the present invention (first apparatus) comprises two pattern rolls, both pattern rolls being inclined toward opposite sides with respect to the transverse direction of the composite film.

An preferred example of the first apparatus comprises (a) a first, upstream-side pattern roll having large numbers of fine, high-hardness particles on the surface, and arranged in a different direction from the transverse direction of the composite film, (b) a second, downstream-side pattern roll having large numbers of fine, high-hardness particles on the surface, and arranged in a direction different from the transverse direction of the composite film and opposite to the first pattern roll, and (c) pluralities of push rolls arranged around the first and second pattern rolls, the thin metal film pushed by the push rolls being brought into sliding contact with the first and second pattern rolls, thereby forming large numbers of substantially parallel, intermittent, linear scratches in plural directions on the thin metal film.

The apparatus for producing a composite film having a linearly-scratched, thin metal film and a plastic film according to another embodiment of the present invention (second apparatus) comprises two pattern rolls, one pattern roll being in parallel to the transverse direction of the composite film, and the other pattern roll being inclined to the transverse direction of the composite film.

A preferred example of the second apparatus comprises (a) a first pattern roll having large numbers of fine, high-hardness particles on the surface, and arranged in a different direction from the transverse direction of the composite film, (b) a second pattern roll having large numbers of fine, high-hardness particles on the surface, and arranged in parallel to the transverse direction of the composite film, and (c) pluralities of push rolls arranged around the first and second pattern rolls, one of the first and second pattern rolls being located on the upstream side in the moving direction of the composite film, and the other being located on the downstream side, the thin metal film pushed by the push rolls being successively brought into sliding contact with the first and second pattern rolls, thereby forming large numbers of substantially parallel, intermittent, linear scratches on the thin metal film in plural directions.

A combination of the first and second apparatuses is also included in the present invention. For instance, two pattern rolls inclined to opposite sides with respect to the moving direction of the composite film may be combined with one pattern roll in parallel to the transverse direction of the composite film. The number of pattern rolls inclined with respect to the moving direction of the composite film may be 3 or more.

In any apparatuses, the directions and crossing angles of linear scratches formed by the first pattern roll and linear scratches formed by the second pattern roll can be controlled by adjusting the angle of each pattern roll to the composite film, and/or the peripheral speed of each pattern roll to the moving speed of the composite film. Also by adjusting the positions and/or angles of the push rolls to the pattern roll, the lateral movement of the composite film can be prevented.

The rotation direction of the pattern roll arranged in a different direction from the transverse direction of the composite film is preferably the same as the moving direction of the composite film.

Any of the first and second apparatuses preferably comprises at least one electric-resistance-measuring means brought into contact with the thin metal film, so that the operation conditions of the apparatus is adjusted depending on electric resistance detected by the electric-resistance-measuring means.

The composite film having a linearly-scratched, thin metal film and a plastic film according to the present invention is suitable for electromagnetic wave absorbers. Laminating pluralities of composite films each having a linearly-scratched, thin metal film and a plastic film directly or via dielectric layers provides improved electromagnetic wave absorbability. In the lamination, all composite films each having a linearly-scratched, thin metal film and a plastic film are preferably arranged such that linear scratches have different directions. The dielectric layer may include an air layer like a honeycomb structure.

The electromagnetic wave absorber of the present invention may be combined with an electromagnetic wave reflector. The electromagnetic wave reflector is a metal sheet, a plastic film provided with a thin metal film, etc. When there is a dielectric layer between the electromagnetic wave absorber and the electromagnetic wave reflector, the thickness of the dielectric layer is preferably a range including ¼ of a center wavelength $\lambda$, of electromagnetic wave noises to be absorbed, for instance, a range of $\lambda/8$ to $\lambda/2$.

DESCRIPTION OF THE BEST MODE OF THE INVENTION

The embodiments of the present invention will be explained referring to the attached drawings, and it should be noted that explanation concerning one embodiment is applicable to other embodiments unless otherwise mentioned. Also, the following explanation is not restrictive, and various modifications may be made within the scope of the present invention.

[1] Composite Film of Linearly-Scratched, Thin Metal Film and Plastic Film

The composite film having a linearly-scratched, thin metal film and a plastic film according to the present invention has a single- or multi-layer, thin metal film on at least one surface of a plastic film. When the multi-layer, thin metal film has a two-layer structure, it is preferably a combination of a thin, magnetic metal layer and a thin, non-magnetic metal layer.

FIGS. 1(a) to 1(d) show an example in which large numbers of substantially parallel, intermittent, linear scratches 12 are formed in two directions on a thin metal film 11 formed on one entire surface of the plastic film 10.

(1) Plastic Film

Resins forming the plastic film 10 are not particularly restrictive as long as they have sufficient strength, flexibility and workability in addition to insulation, and they may be, for instance, polyesters (polyethylene terephthalate, etc.), polyarylene sulfide (polyphenylene sulfide, etc.), polyamides, polyimides, polyamideimides, polyether sulfone, polyetheretherketone, polycarbonates, acrylic resins, polystyrenes, polyolefins (polyethylene, polypropylene, etc.), etc. The thickness of the plastic film 10 may be about 10-100 µm.

(2) Thin Metal Film

Metals forming the thin metal film 11 are not particularly restrictive as long as they have conductivity, and they are preferably aluminum, copper, nickel, cobalt, silver and their alloys, particularly aluminum, copper, nickel and their alloys from the aspect of corrosion resistance and cost. The thickness of the thin metal film is preferably 0.01 µm or more. Though not restrictive, the upper limit of the thickness may be practically about 10 µm. Of course, the thin metal film may be thicker than 10 µm, with substantially no change in the absorbability of high-frequency electromagnetic waves. The thickness of the thin metal film is more preferably 0.01-5 µm, most preferably 0.01-1 µm, particularly 10-100 nm. The thin metal film 11 can be formed by a vapor deposition methods (physical vapor deposition methods such as a vacuum vapor deposition method, a sputtering method and an ion plating method, or chemical vapor deposition methods such as a plasma CVD method, a thermal CVD method and a photo CVD method), plating methods, or foil-bonding methods.

(3) Linear Scratches

Figure 1A:
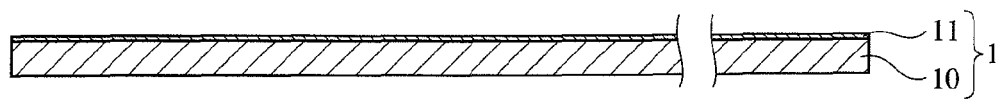
FIG. 1(a) is a cross-sectional view showing a composite film having a linearly-scratched, thin metal film and a plastic film according to one embodiment of the present invention.
Figure 1B:
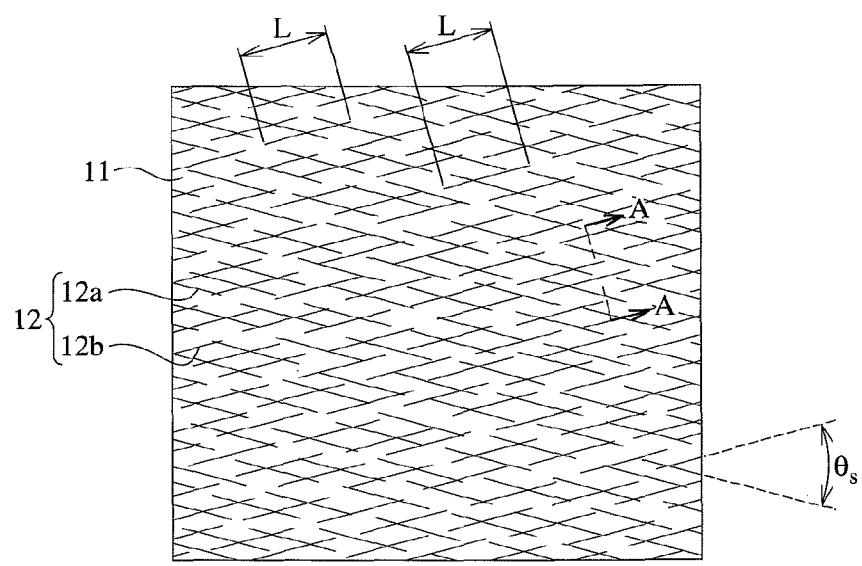
FIG. 1(b) is a partial plan view showing the details of linear scratches in the composite film having a linearly-scratched, thin metal film and a plastic film shown in FIG. 1(a).
Figure 1C:
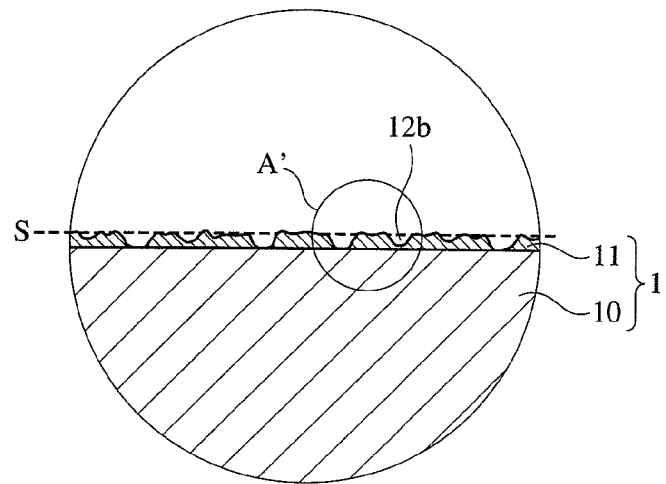
FIG. 1(c) is a cross-sectional view taken along the line A-A in FIG. 1(b).
Figure 1D:
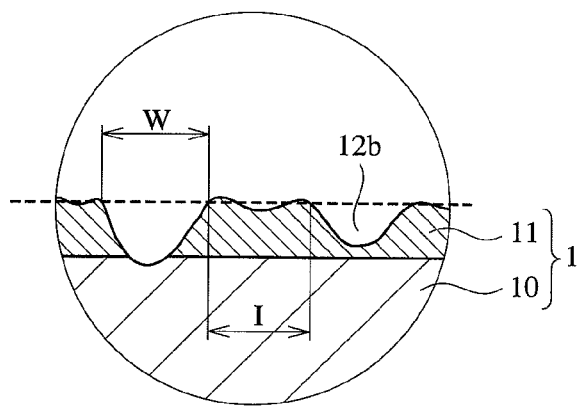
FIG. 1(d) is an enlarged cross-sectional view showing a portion A' in FIG. 1(c).

As shown in FIGS. 1(b) and 1(c), the thin metal film 11 is provided with large numbers of substantially parallel, intermittent, linear scratches 12a, 12b with irregular widths and intervals in two directions. The depth of the linear scratches 12 is exaggerated in FIG. 1(c) for the purpose of explanation. The linear scratches 12 oriented in two directions have various widths W and intervals I. The widths W of the linear scratches 12 are measured at a height corresponding to the surface S of the thin metal film 11 before forming linear scratches. The intervals I of the linear scratches 12 are obtained at a height corresponding to the surface S of the thin metal film 11 before forming linear scratches. Because the linear scratches 12 have various widths W and intervals I, the composite film having a linearly-scratched, thin metal film and a plastic film according to the present invention can efficiently absorb electromagnetic waves in a wide frequency range.

90% or more of the widths W of the linear scratches 12 are preferably in a range of 0.1-1,000 μm, more preferably in a range of 0.1-100 μm, most preferably in a range of 0.1-20 μm. The average width Wav of the linear scratches 12 is preferably 1-100 μm, more preferably 1-20 μm, most preferably 1-10 μm.

The intervals I of the linear scratches 12 are preferably in a range from 0.1 μm to 5 mm, more preferably in a range of 0.1-1,000 μm, most preferably in a range of 0.1-100 μm, particularly in a range of 0.1-20 μm. The average interval Iav of the linear scratches 12 is preferably 1-100 μm, more preferably 1-20 μm, most preferably 1-10 μm.

Because the lengths L of the linear scratches 12 are determined by sliding conditions (mainly relative peripheral speeds of the roll and film, and the angle of the film winding around the roll), they are substantially the same unless the sliding conditions are changed (substantially equal to the average length). The lengths of the linear scratches 12 may be practically about 1-100 mm, though not particularly restrictive.

Figure 2A:
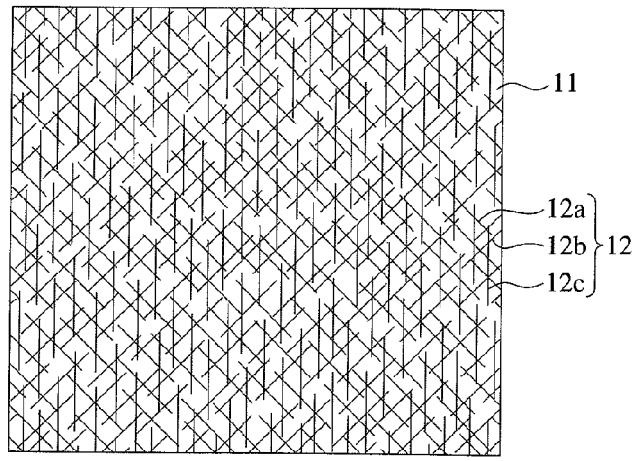
FIG. 2(a) is a partial plan view showing the details of linear scratches in the composite film having a linearly-scratched, thin metal film and a plastic film according to another embodiment of the present invention.
Figure 2B:
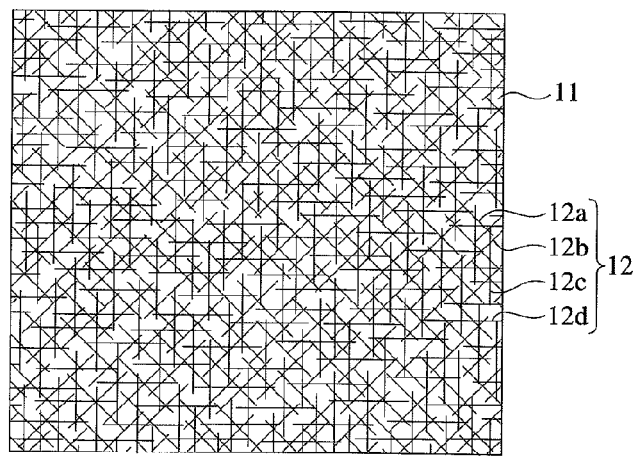
FIG. 2(b) is a partial plan view showing the details of linear scratches in the composite film having a linearly-scratched, thin metal film and a plastic film according to a further embodiment of the present invention.
Figure 2C:
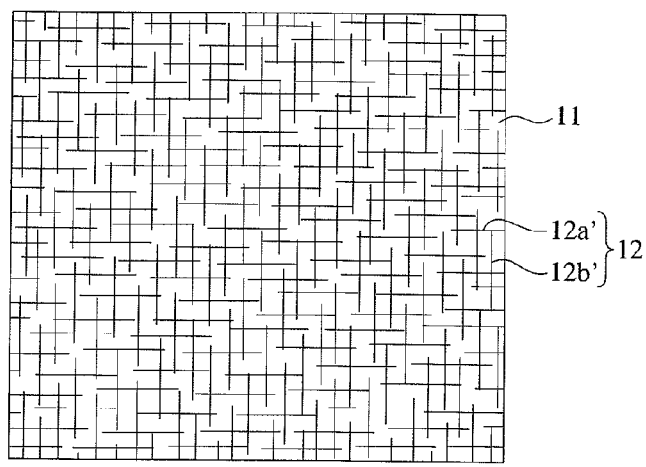
FIG. 2(c) is a partial plan view showing the details of linear scratches in the composite film having a linearly-scratched, thin metal film and a plastic film according to a still further embodiment of the present invention.

The acute crossing angle (hereinafter referred to simply as "crossing angle" unless otherwise mentioned) θs of the linear scratches 12a, 12b are preferably 10° or more and less than 90°, more preferably 20-70°. With sliding conditions (sliding direction, peripheral speed ratio, etc.) between the thin metal film-plastic composite film and the pattern roll adjusted, linear scratches 12 with various crossing angles θs can be formed as shown in FIGS. 2(a) to 2(c).

(4) Fine Pores

Figure 3A:
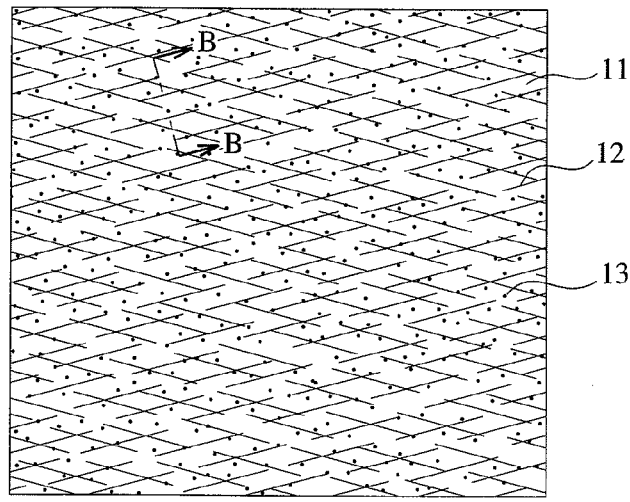
FIG. 3(a) is a partial plan view showing the details of linear scratches and fine pores in the composite film having a linearly-scratched, thin metal film and a plastic film according to a still further embodiment of the present invention.
Figure 3B:
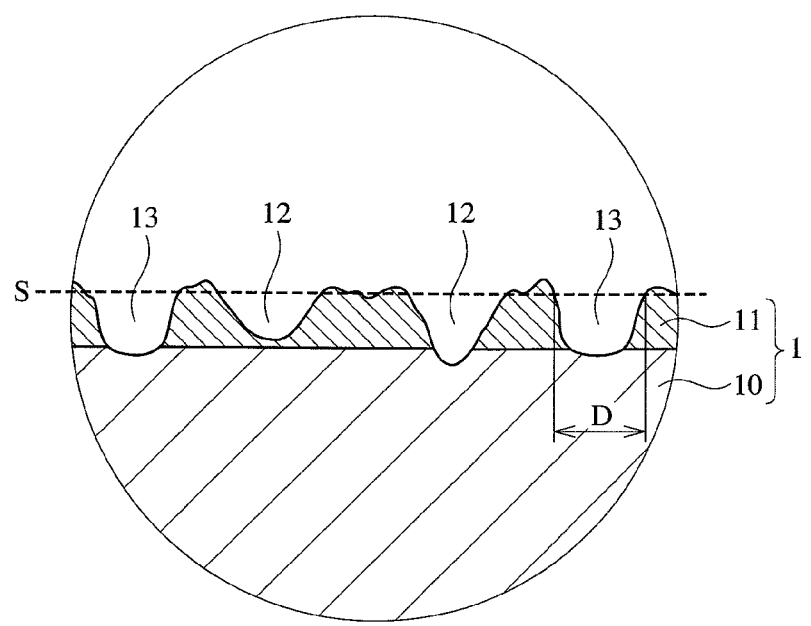
FIG. 3(b) is a cross-sectional view taken along the line B-B in FIG. 3(a).

As shown in FIGS. 3(a) and 3(b), the thin metal film 11 may be provided with large numbers of fine penetrating pores 13 at random in addition to the linear scratches 12. The fine pores 13 can be formed by pressing a roll having fine, high-hardness particles on the surface to the thin metal film 11. As shown in FIG. 3(b), the opening diameters D of the fine pores 13 are determined at a height corresponding to the surface S of the thin metal film 11 before forming the linear scratches. 90% or more of the opening diameters D of the fine pores 13 are preferably in a range of 0.1-1,000 μm, more preferably in a range of 0.1-500 μm. The average opening diameter Day of the fine pores 13 is preferably in a range of 0.5-100 μm, more preferably in a range of 1-50 μm.

(5) Protective Layer

Figure 4:
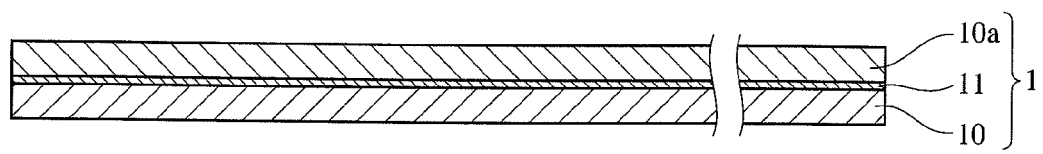
FIG. 4 is a cross-sectional view showing a composite film having a linearly-scratched, thin metal film and a plastic film according to a still further embodiment of the present invention.

As shown in FIG. 4, a protective plastic layer 10a for covering the linear scratches 12 (and fine pores 13) is preferably formed on the thin metal film 11. The protective layer 10a is preferably as thick as 10-100 μm.

(6) Surface Resistance

The electromagnetic wave reflection coefficient RC of the composite film 1 having a linearly-scratched, thin metal film and a plastic film is represented by RC=(R−Z)/(R+Z), wherein R is the surface resistance (Ω/square) of the thin metal film 11, and Z is the characteristic impedance (Ω) of electromagnetic waves, which is 0 when R=Z. The surface resistance of the thin metal film 11 can be adjusted by the material and thickness of the thin metal film 11, the widths, intervals and lengths of linear scratches 12, etc. The surface resistance can be measured by a DC two-terminal method.

The characteristic impedance Z of electromagnetic waves changes drastically depending on the distance from an electromagnetic wave source at a position close to the electromagnetic wave source, and is equal to the characteristic impedance (377Ω) of free space at a position sufficiently far from the electromagnetic wave source. Accordingly, when the composite film 1 having a linearly-scratched, thin metal film and a plastic film is positioned near the electromagnetic wave source, R is adjusted as close to Z as possible. When the composite film 1 having a linearly-scratched, thin metal film and a plastic film is located at a position sufficiently far from the electromagnetic wave source, R is made closer to the characteristic impedance of free space.

Figure 5A:
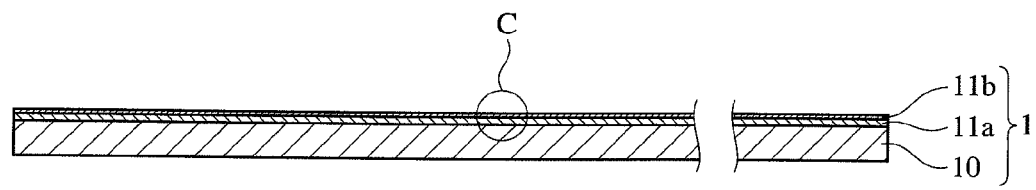
FIG. 5(a) is a cross-sectional view showing a composite film having a linearly-scratched, thin metal film and a plastic film according to a still further embodiment of the present invention.
Figure 5B:
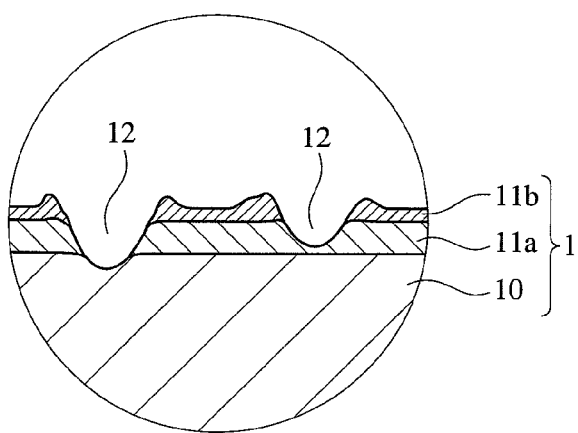
FIG. 5(b) is an enlarged cross-sectional view showing a portion C in FIG. 5(a).

As shown in FIGS. 5(a) and 5(b), the plastic film 10 may have pluralities of thin metal films 11a, 11b. It is preferable that one thin metal film is formed by a non-magnetic metal, while the other is formed by a magnetic metal. Even in the multi-layer, thin metal films 11a, 11b, the linear scratches 12 per se may be the same as shown in FIGS. 1(a) to 2(c). The non-magnetic metals are copper, silver, aluminum, tin or their alloys, and the magnetic metals are nickel, cobalt, chromium or their alloys. A preferable combination is nickel and copper or aluminum. The thin, magnetic metal layer is preferably as thick as 0.01 μm or more, and the thin, non-magnetic metal layer is preferably as thick as 0.1 μm or more. Though not particularly restrictive, the upper limit of the thickness may be practically about 10 μm for both. More preferably, the thin, magnetic metal layer is as thick as 0.01-5 μm, and the thin, non-magnetic metal layer is as thick as 0.1-5 μm.

[2] Production Apparatus of Composite Film Having a Linearly-Scratched, Thin Metal Film and a Plastic Film FIGS. 6(a) to 6(e) show one example of apparatuses for forming linear scratches in two directions. This apparatus comprises (a) a reel 21 from which a thin metal film-plastic composite film 100 is wound off, (b) a first pattern roll 2a arranged in a different direction from the transverse direction of the composite film 100 on the side of the thin metal film 11, (c) a first push roll 3a arranged upstream of the first pattern roll 2a on the opposite side to the thin metal film 11, (d) a second pattern roll 2b arranged in an opposite direction to the first pattern roll 2a with respect to the transverse direction of the composite film 100 on the side of the thin metal film 11, (e) a second push roll 3b arranged downstream of the second pattern roll 2b on the opposite side to the thin metal film 11, (f) an electric-resistance-measuring means 4a arranged on the side of the thin metal film 11 between the first and second pattern rolls 2a, 2b, (g) an electric-resistance-measuring means 4b arranged downstream of the second pattern roll 2b on the side of the thin metal film 11, and (h) a reel 24, around which the composite film 1 having a linearly-scratched, thin metal film and a plastic film is wound. In addition, pluralities of guide rolls 22, 23 are arranged at predetermined positions. Each pattern roll 2a, 2b is supported by a backup roll (for instance, rubber roll) 5a, 5b to prevent bending.

Figure 6A:
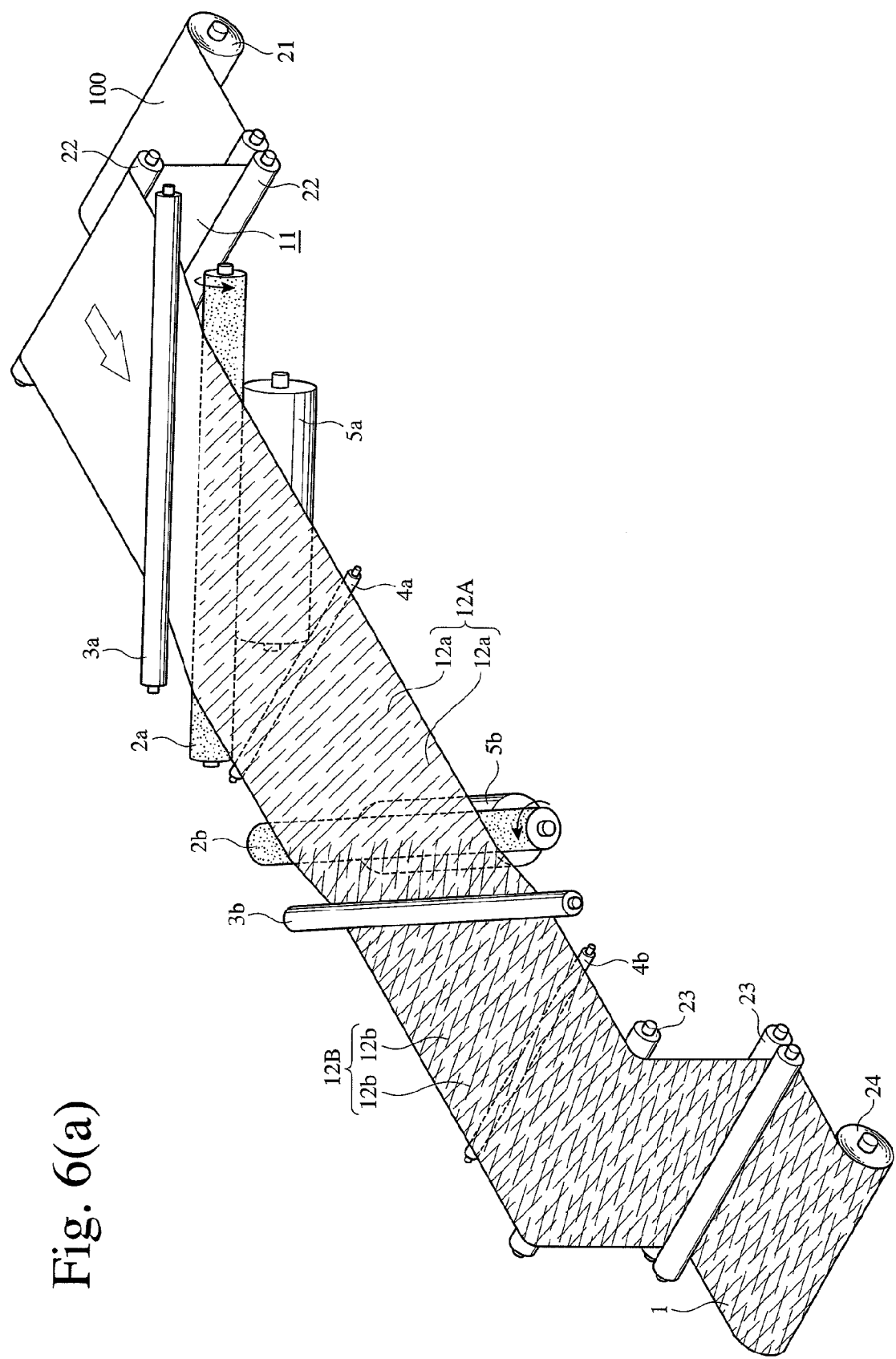
FIG. 6(a) is a perspective view showing one example of apparatuses for producing a composite film having a linearly-scratched, thin metal film and a plastic film according to the present invention.
Figure 6B:
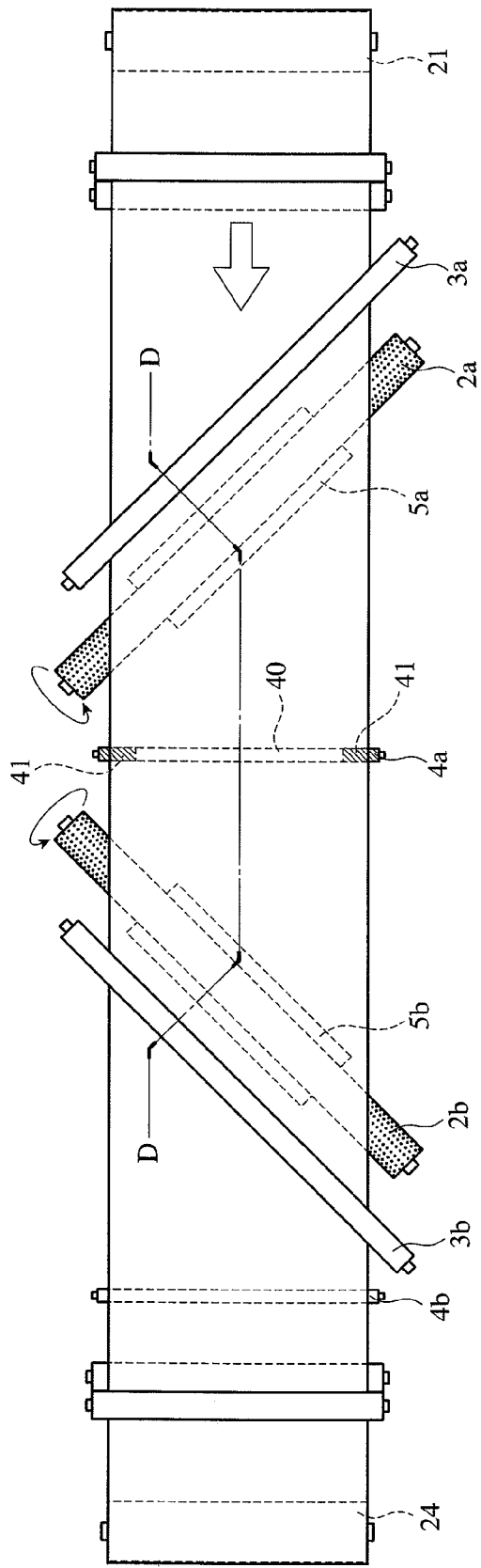
FIG. 6(b) is a plan view showing the apparatus of FIG. 6(a).
Figure 6C:
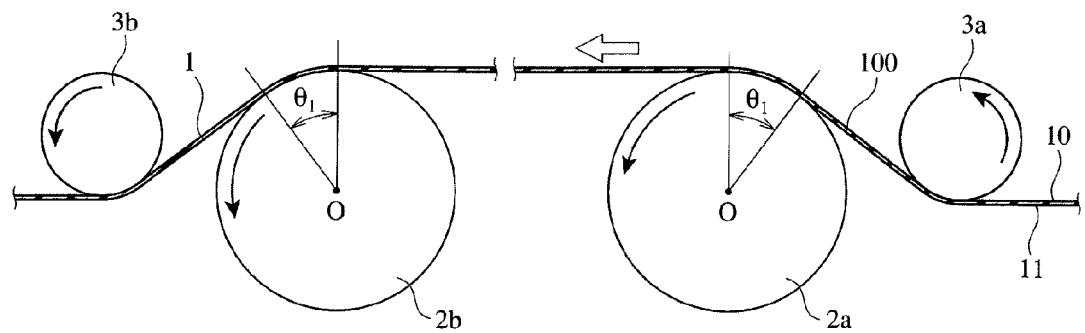
FIG. 6(c) is a cross-sectional view taken along the line D-D in FIG. 6(b).

As shown in FIG. 6(c), because each push roll 3a, 3b comes into contact with the composite film 100 at a lower position than the position at which it is brought into sliding contact with each pattern roll 2a, 2b, the thin metal film 11 of the composite film 100 is pushed by each pattern roll 2a, 2b. By adjusting the longitudinal position of each push roll 3a, 3b with this condition met, the pressing power of each pattern roll 2a, 2b to the thin metal film 11 can be controlled, and the sliding distance in proportional to the center angle $\theta_1$ can also be controlled.

Figure 6D:
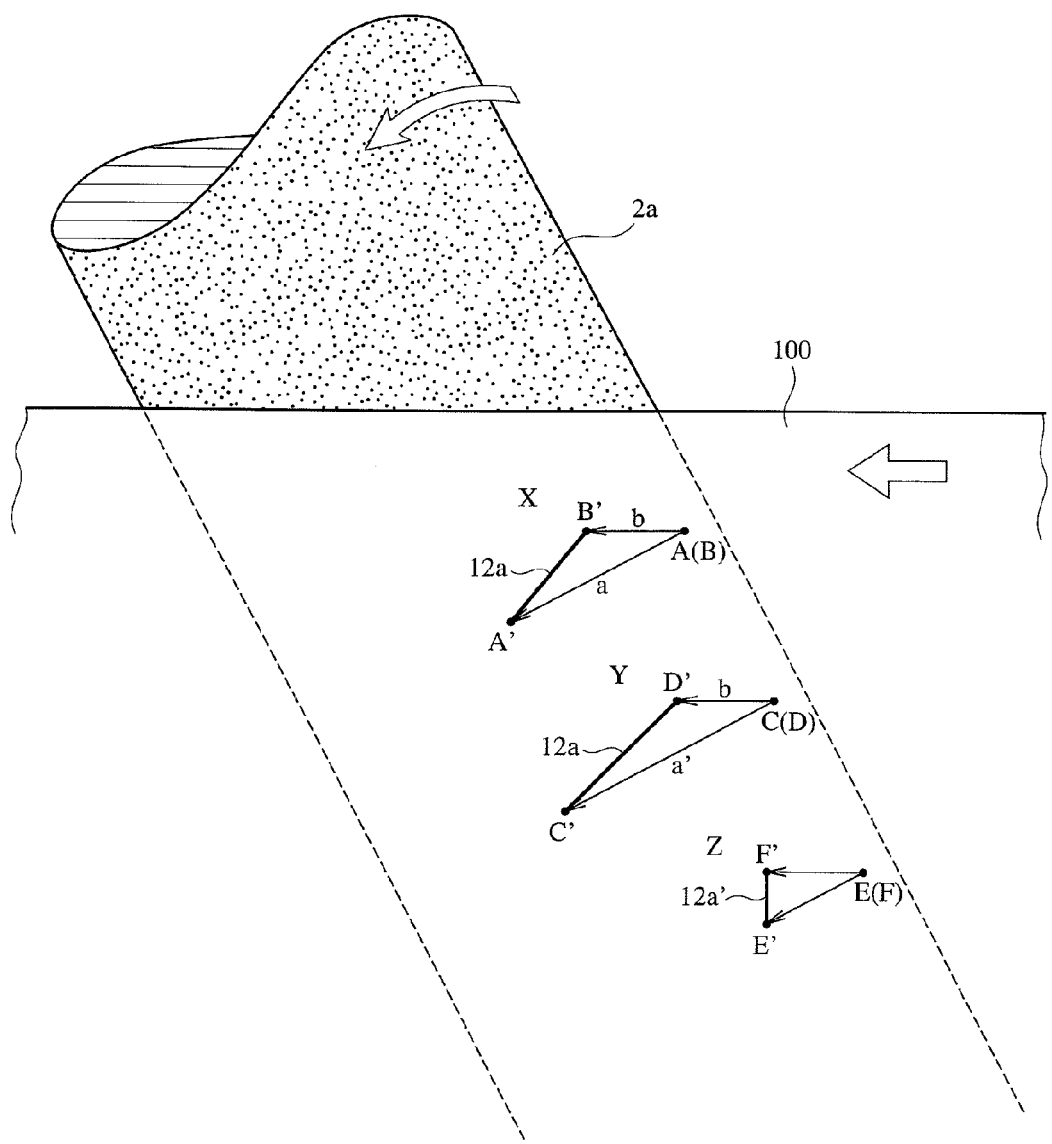
FIG. 6(d) is a partial enlarged plan view for explaining the principle of forming linear scratches inclined to the moving direction of the composite film.
Figure 6E:
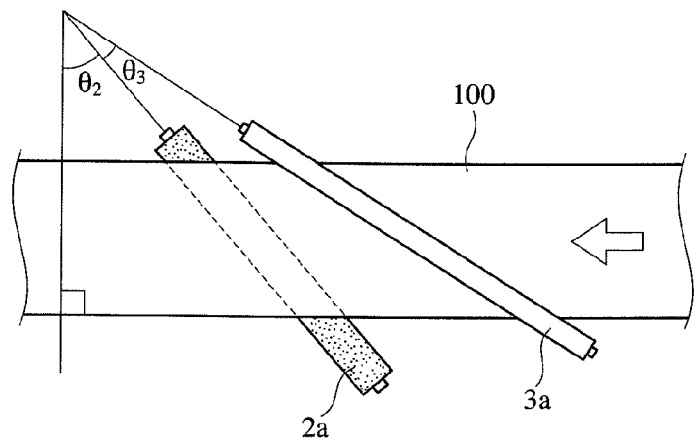
FIG. 6(e) is a partial plan view showing the inclination angles of a pattern roll and a push roll to a composite film in the apparatus of FIG. 6(a).

FIG. 6(d) shows the principle that linear scratches 12a are formed on the composite film 100 with inclination to the moving direction thereof. Because the pattern roll 2a is inclined to the moving direction of the composite film 100, the moving direction (rotation direction) a of fine, hard particles on the pattern roll 2a differs from the moving direction b of the composite film 100. After a fine, hard particle on a point A on the pattern roll 2a comes into contact with the thin metal film 11 to form a scratch B at an arbitrary time as shown by X, the fine, hard particle moves to a point A', and the scratch B moves to a point B', in a predetermined period of time. While the fine, hard particle moves from the point A to the point A', the scratch is continuously formed, resulting in a linear scratch 12a extending from the point A' to the point B'.

The directions and crossing angle θs of the first and second linear scratch groups 12A, 12B formed by the first and second pattern rolls 2a, 2b can be adjusted by changing the angle of each pattern roll 2a, 2b to the composite film 100, and/or the peripheral speed of each pattern roll 2a, 2b relative to the moving speed of the composite film 100. For instance, when the peripheral speed a of the pattern roll 2a relative to the moving speed b of the composite film 100 increases, the linear scratches 12a can be inclined 45° to the moving direction of the composite film 100 like a line C'D' as shown by Y in FIG. 6(d). Similarly, the peripheral speed a of the pattern roll 2a can be changed by changing the inclination angle $\theta_2$ of the pattern roll 2a to the transverse direction of the composite film 100. This is true of the pattern roll 2b. Accordingly, with both pattern rolls 2a, 2b adjusted, the directions of the linear scratches 12a, 12b can be changed as illustrated in FIGS. 1(b) and 2(c).

Because each pattern roll 2a, 2b is inclined to the composite film 100, sliding with each pattern roll 2a, 2b provides the composite film 100 with a force in a transverse direction. Accordingly, to prevent the lateral movement of the composite film 100, the longitudinal position and/or angle of each push roll 3a, 3b to each pattern roll 2a, 2b are preferably adjusted. For instance, the proper adjustment of a crossing angle $\theta_3$ between the axis of the pattern roll 2a and the axis of the push roll 3a provides pressing power with such a transverse direction distribution as to cancel transverse components, thereby preventing the lateral movement. The adjustment of a distance between the pattern roll 2a and the push roll 3a also contributes to the prevention of the lateral movement. To prevent the lateral movement and breakage of the composite film 100, the rotation directions of the first and second pattern rolls 2a, 2b inclined to the transverse direction of the composite film 100 are preferably the same as the moving direction of the composite film 100.

As shown in FIG. 6(b), each roll-shaped electric-resistance-measuring means 4a, 4b comprises a pair of electrodes 41, 41 via an insulating portion 40, to measure the electric resistance of the thin metal film with linear scratches 11 therebetween. Feedbacking the electric resistance measured by the electric-resistance-measuring means 4a, 4b, operation conditions such as the moving speed of the composite film 100, the rotation speeds and inclination angles $\theta_2$ of the pattern rolls 2a, 2b, the positions and inclination angles $\theta_3$ of the push rolls 3a, 3b, etc. are adjusted.

Figure 7:
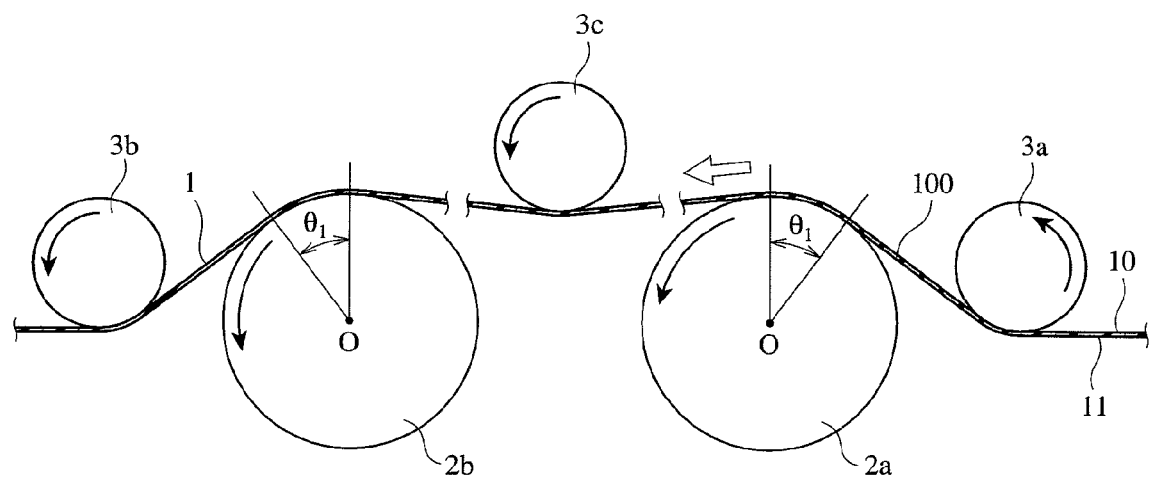
FIG. 7 is a partial cross-sectional view showing another example of apparatuses for producing a composite film having a linearly-scratched, thin metal film and a plastic film according to the present invention.

To increase the power of the pattern rolls 2a, 2b pressing the composite film 100, a third push roll 3c may be provided between the pattern rolls 2a, 2b as shown in FIG. 7. The third push roll 3c increases the sliding distance of the thin metal film 11 proportional to the center angle $\theta_1$, resulting in longer linear scratches 12a, 12b. The adjustment of the position and inclination angle of the third push roll 3c contributes to the prevention of the lateral movement of the composite film 100.

Figure 8:
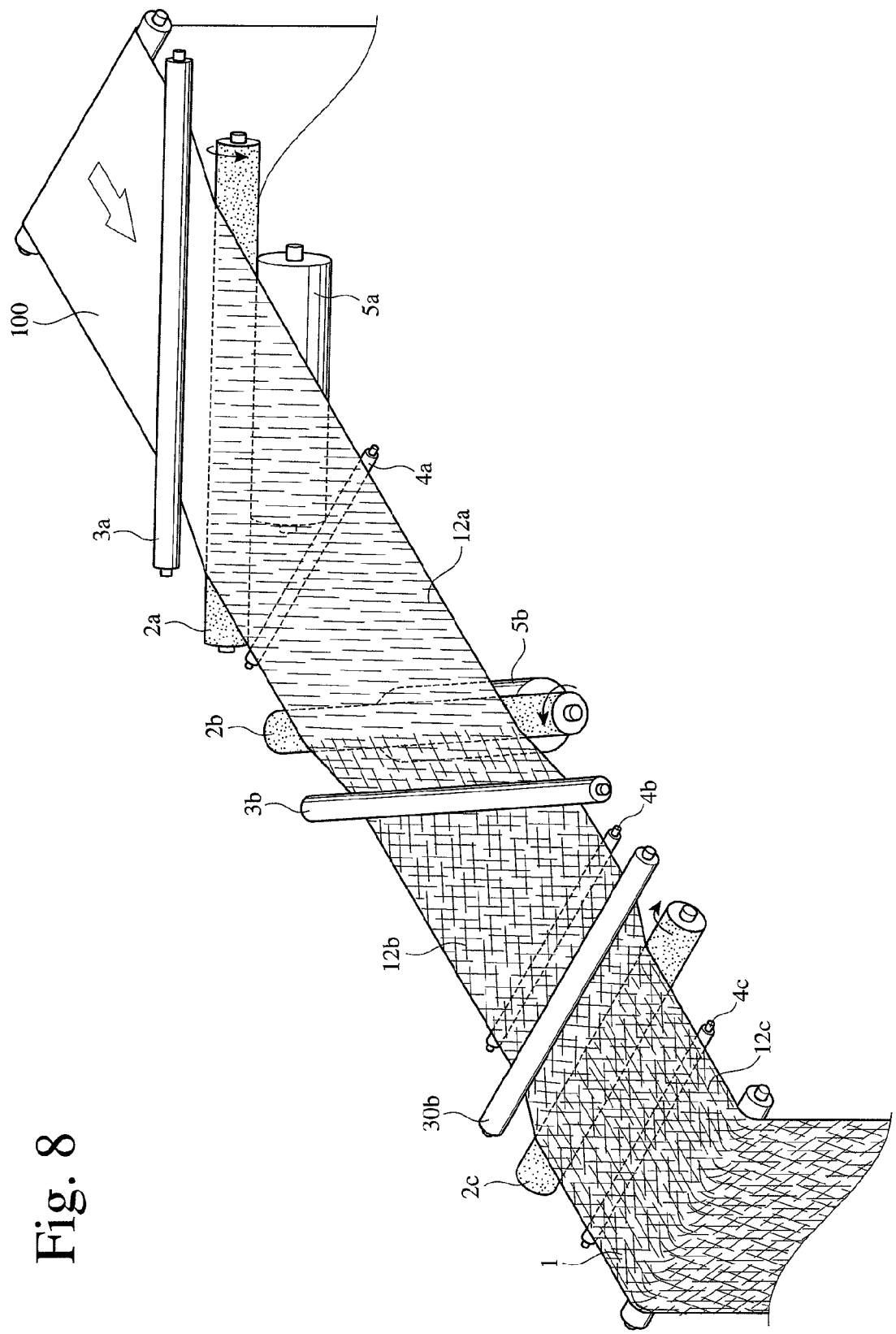
FIG. 8 is a perspective view showing a further example of apparatuses for producing a composite film having a linearly-scratched, thin metal film and a plastic film according to the present invention.

FIG. 8 shows one example of apparatuses for forming linear scratches oriented in three directions as shown in FIG. 2(a). This apparatus is different from the apparatus shown in FIGS. 6(a) to 6(e) in that it comprises a third pattern roll 2c parallel to the transverse direction of the composite film 100 downstream of the second pattern roll 2b. Though the rotation direction of the third pattern roll 2c may be the same as or opposite to the moving direction of the composite film 100, it is preferably an opposite direction to form linear scratches efficiently. The third pattern roll 2c parallel to the transverse direction forms linear scratches 12c aligned with the moving direction of the composite film 100. Though the third push roll 30b is arranged upstream of the third pattern roll 2c, it may be on the downstream side. An electric-resistance-measuring roll 4c may be arranged downstream of the third pattern roll 2c. Not restricted to the depicted examples, the third pattern roll 2c may be arranged upstream of the first pattern roll 2a, or between the first and second pattern rolls 2a, 2b.

Figure 9:
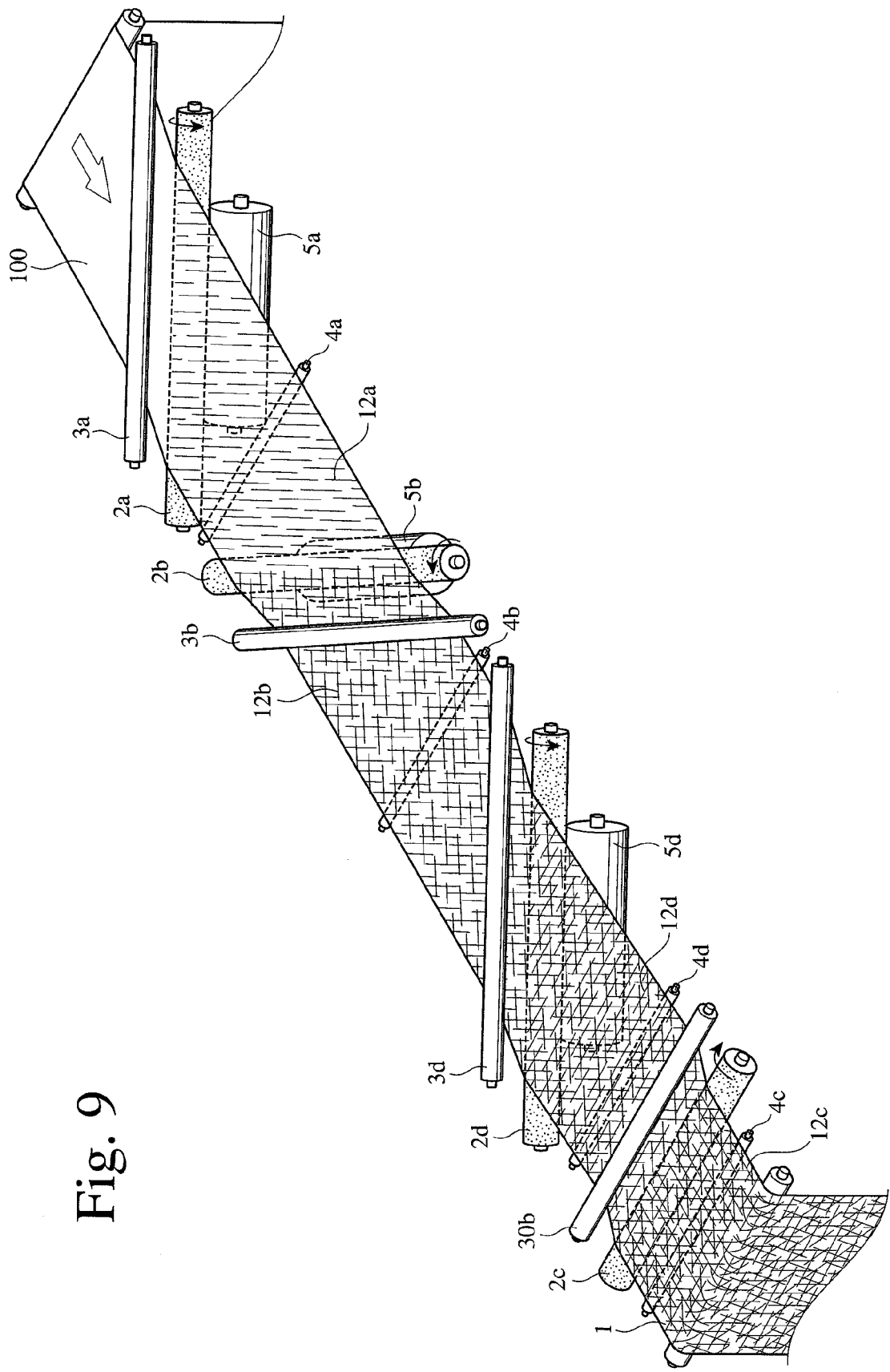
FIG. 9 is a perspective view showing a still further example of apparatuses for producing a composite film having a linearly-scratched, thin metal film and a plastic film according to the present invention.

FIG. 9 shows one example of apparatuses for forming linear scratches oriented in four directions as shown in FIG. 2(b). This apparatus is different from the apparatus shown in FIG. 8, in that it comprises a fourth pattern roll 2d between the second pattern roll 2b and the third pattern roll 2c, and a fourth push roll 3d upstream of the fourth pattern roll 2d. With a slower rotation speed of the fourth pattern roll 2d, the direction (line E'F') of linear scratches 12a' can be made in parallel to the transverse direction of the composite film 100 as shown by Z in FIG. 6(d).

Figure 10:
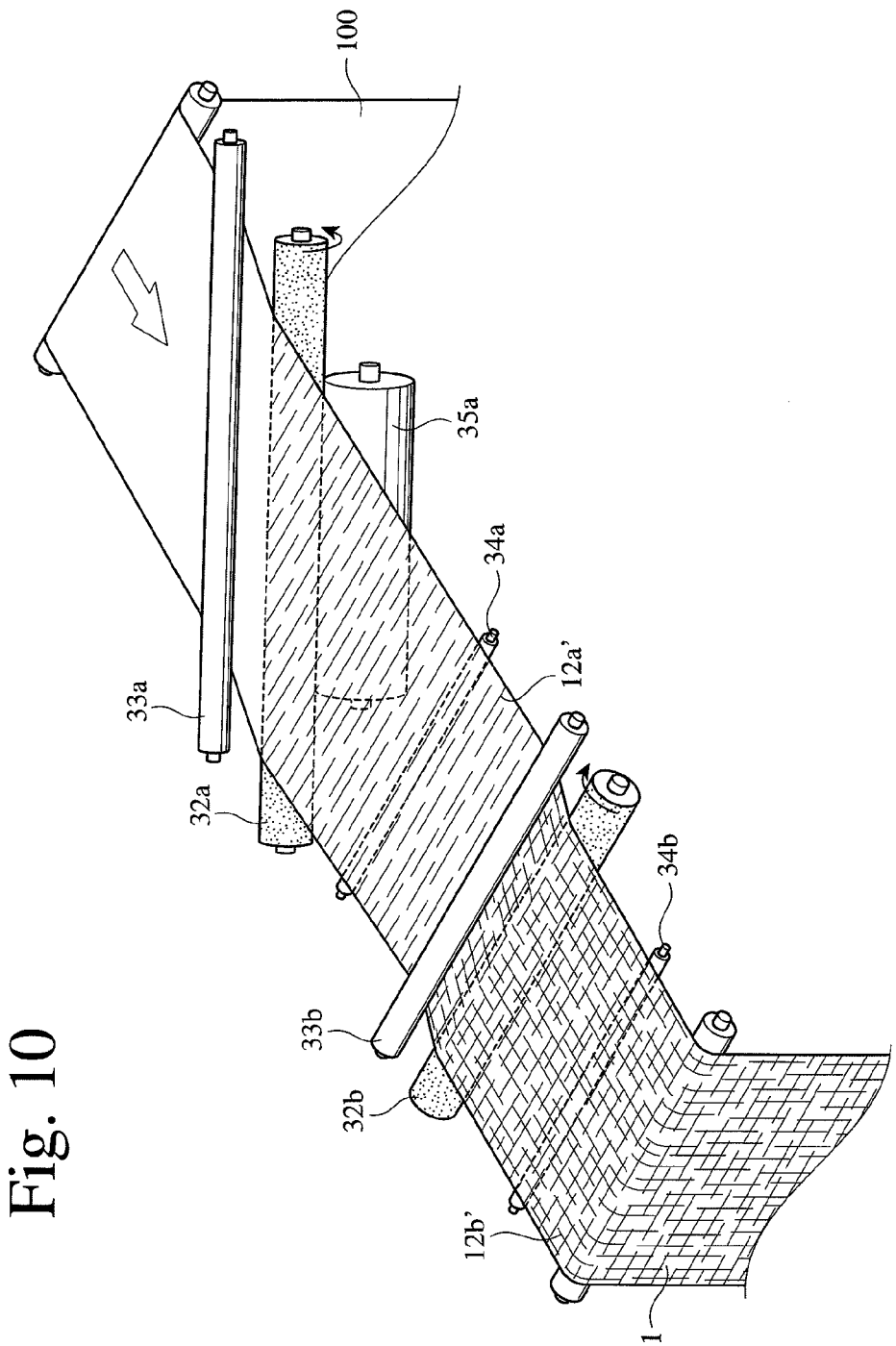
FIG. 10 is a perspective view showing a still further example of apparatuses for producing a composite film having a linearly-scratched, thin metal film and a plastic film according to the present invention.

FIG. 10 shows another example of apparatuses for forming linear scratches oriented in two directions as shown in FIG. 2(c). This apparatus is different from the apparatus shown in FIGS. 6(a) to 6(e), in that a second pattern roll 32b is in parallel to the transverse direction of the composite film 100. Only portions different from those shown in FIGS. 6(a) to 6(e) will thus be explained. The rotation direction of the second pattern roll 32b may be the same as or opposite to the moving direction of the composite film 100. Also, the second push roll 33b may be upstream or downstream of the second pattern roll 32b. This apparatus makes the direction (line E'F') of linear scratches 12a' in alignment with the transverse direction of the composite film 100 as shown by Z in FIG. 6(d), suitable for forming linear scratches shown in FIG. 2(c).

Operation conditions determining not only the inclination angles and crossing angles of linear scratches but also their depths, widths, lengths and intervals are the moving speed of the composite film 100, the rotation speeds and inclination angles and pressing powers of the pattern rolls, etc. The moving speed of the composite film is preferably 5-200 m/minute, and the peripheral speed of the pattern roll is preferably 10-2,000 m/minute. The inclination angles $\theta_2$ of the pattern rolls are preferably 20°-60°, particularly about 45°. The tension (in parallel to the pressing power) of the composite film 100 is preferably 0.05-5 kgf/cm width.

The pattern roll used in the apparatus of the present invention is preferably a roll having fine particles with sharp edges and Mohs hardness of 5 or more on the surface, for instance, the diamond roll described in JP 2002-59487 A. Because the widths of linear scratches are determined by the sizes of fine particles, 90% or more of fine diamond particles preferably have sizes in a range of 1-1,000 μm, more preferably in a range of 10-200 μm. The fine diamond particles are attached to the roll surface preferably in an area ratio of 50% or more.

The thin metal film 11 having linear scratches 12 may be provided with large numbers of fine pores 13 by the method described in Japanese Patent 2063411. A roll per se for forming fine pores 13 may be the same as the roll for forming linear scratches. Fine pores 13 can be formed by causing the composite film 100 to pass between a roll having large numbers of fine particles with sharp edges and Mohs hardness of 5 or more on the surface like the roll for forming linear scratches and a roll having a smooth surface at the same peripheral speed.

[3] Properties and use of composite film having a linearly-scratched, thin metal film and a plastic film Because of large numbers of intermittent, irregular linear scratches formed in plural directions, the composite film having a linearly-scratched, thin metal film and a plastic film according to the present invention has high absorbability to electromagnetic wave noises in various frequencies, with small change of electromagnetic wave absorbability depending on incident directions (anisotropy). Further, it can efficiently absorb both TE waves (electromagnetic waves having electric field components perpendicular to the incident surface), and TM waves (electromagnetic waves having magnetic field components perpendicular to the incident surface).

The composite film having a linearly-scratched, thin metal film and a plastic film having such features are suitable for the prevention of the leak and intrusion of electromagnetic wave noises and the leak of information in electronic appliances such as cell phones, personal computers and television sets, RFID (radio frequency identification) systems used in communications apparatuses, IC tags and non-contact IC cards, wireless LAN systems, automatic toll collecting systems on toll roads, etc.

[4] Electromagnetic Wave Absorber

The composite film having a linearly-scratched thin metal film and a plastic film according to the present invention can be used as an electromagnetic wave absorber by itself, but pluralities of composite films each having a linearly-scratched, thin metal film and a plastic film may be laminated directly or via a dielectric layer if necessary. Electromagnetic waves reflected or passed without being absorbed by one composite film having a linearly-scratched, thin metal film and a plastic film are absorbed by another composite film having a linearly-scratched, thin metal film and a plastic film, resulting in remarkably improved electromagnetic wave absorbability.

Composite films each having a linearly-scratched, thin metal film and a plastic film to be combined need not to have thin metal films of the same type, but may have thin metal films of different types. For instance, both electric field components and magnetic field components can be efficiently absorbed with smaller anisotropy of electromagnetic wave absorbability, in a combination of two composite films each having a linearly-scratched, thin metal film and a plastic film with different crossing angles of linear scratches, one having surface resistance of 20-377 Ω/square, preferably 30-377 Ω/square, and the other having surface resistance of 377-10,000 Ω/square, preferably 377-7,000 Ω/square. In this combination, the crossing angles θs of linear scratches are preferably 20-70° in both composite films each having a linearly-scratched, thin metal film and a plastic film. Also preferable is a combination of a first composite film of a linearly-scratched, thin, magnetic metal (for instance, nickel) film and a plastic film, and a second composite film of a linearly-scratched, thin, non-magnetic metal (for instance, aluminum or copper) film and a plastic film.

When there is a dielectric layer between the composite films each having a linearly-scratched, thin metal film and a plastic film, a gap between the composite films each having a linearly-scratched, thin metal film and a plastic film is preferably 0.2-10 mm, more preferably 1-8 mm.

Figure 11:
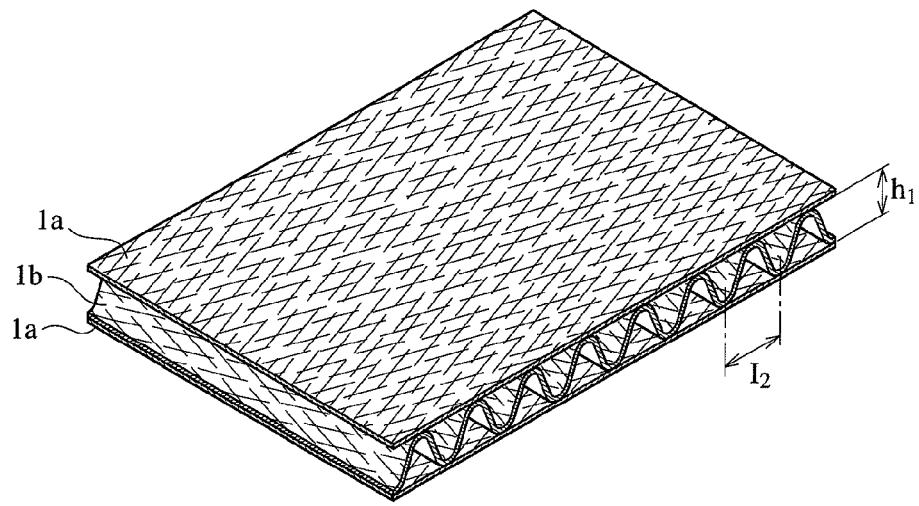
FIG. 11 is a perspective view showing a multi-layer electromagnetic wave absorber comprising the composite film having a linearly-scratched, thin metal film and a plastic film according to the present invention.

FIG. 11 shows one example of multi-layer, electromagnetic wave absorbers having a structure comprising a corrugated composite film 1b having a linearly-scratched, thin metal film and a plastic film between two flat composite films 1a, 1a each having a linearly-scratched, thin metal film and a plastic film. The corrugation of the composite film 1b having a linearly-scratched, thin metal film and a plastic film may be constituted by sinusoids, continuously connected arches, continuously connected U shapes, etc. Because the flat composite films 1a, 1a each having a linearly-scratched, thin metal film and a plastic film are bonded to the corrugated composite film 1b having a linearly-scratched, thin metal film and a plastic film along lines, this multi-layer, electromagnetic wave absorber has sufficient self-supportability, suitable for use in electronic apparatuses and communications apparatuses and buildings. The height $h_1$ and interval $I_2$ of the corrugation is preferably 0.2-3 mm when mounted in casings for electronic apparatuses and communications apparatuses, and 3-10 mm when mounted in inner walls of buildings for excellent heat insulation and sound absorption.

Flat composite films 1a each having a linearly-scratched, thin metal film and a plastic film and corrugated composite films 1b each having a linearly-scratched, thin metal film and a plastic film may be laminated alternately. In this case, the composite films 1b each having a linearly-scratched, thin metal film and a plastic film may have different corrugation orientations.

Figure 12A:
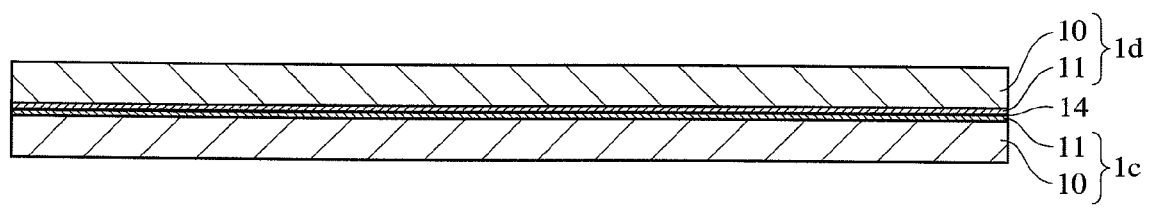
FIG. 12(a) is a cross-sectional view showing another example of multi-layer electromagnetic wave absorbers comprising the composite film having a linearly-scratched, thin metal film and a plastic film according to the present invention.
Figure 12B:
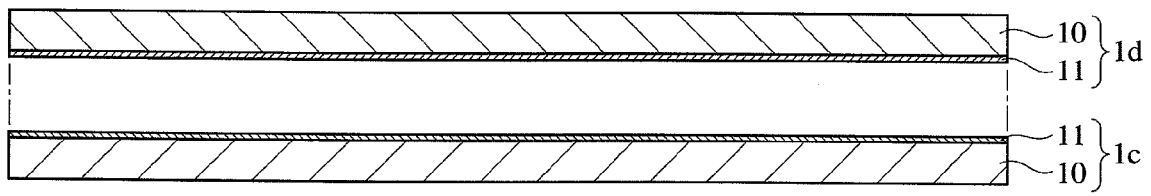
FIG. 12(b) is an exploded cross-sectional view of FIG. 12(a).

FIGS. 12(a) and 12(b) show an example of multi-layer, electromagnetic wave absorbers comprising two composite films 1c, 1d each having a linearly-scratched, thin metal film and a plastic film, which are bonded to each other on the side of the thin metal films 11, 11. 14 represents an adhesive layer.

[5] Composite Electromagnetic Wave Absorber

Figure 13:
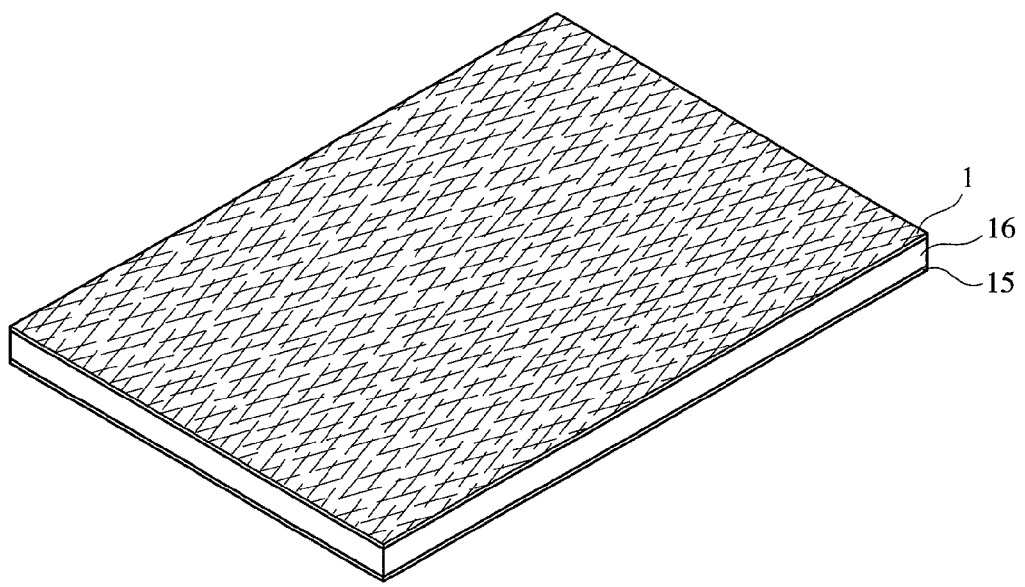
FIG. 13 is a perspective view showing a still further example of composite electromagnetic wave absorbers comprising the composite film having a linearly-scratched, thin metal film and a plastic film according to the present invention.

As shown in FIG. 13, the composite film having a linearly-scratched, thin metal film and a plastic film according to the present invention may be combined with an electromagnetic wave reflector to form a composite electromagnetic wave absorber. This composite electromagnetic wave absorber is obtained by laminating a composite film 1 having the linearly-scratched, thin metal film and a plastic film and an electromagnetic wave reflector 15 via a dielectric layer 16. The composite film 1 having a linearly-scratched, thin metal film and a plastic film is arranged on the side of an electromagnetic wave source. The electromagnetic wave reflector 15 is a metal sheet, net or mesh, a plastic film on which a thin metal film is formed, etc. The dielectric layer 16 may be a solid dielectric body made of plastics, etc., or a porous structure including an air layer. The thickness of the dielectric layer 16 is preferably in a range including ¼ of a center wavelength λ of electromagnetic waves to be absorbed, for instance, in a range from λ/8 to λ/12.

Figure 14:
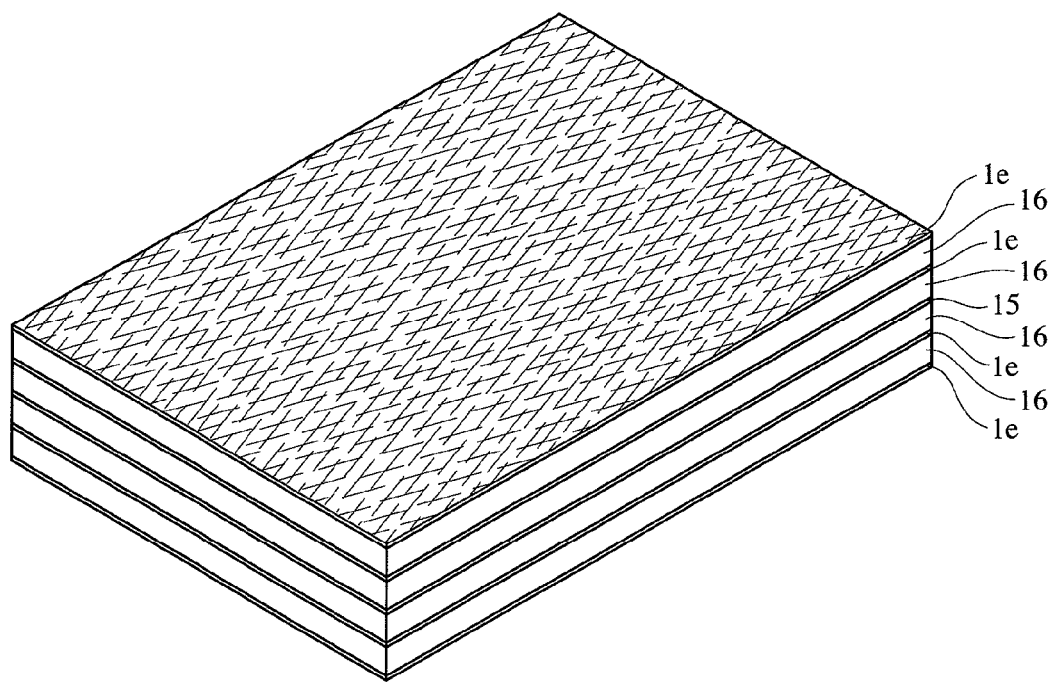
FIG. 14 is a perspective view showing a still further example of composite electromagnetic wave absorbers comprising the composite film having a linearly-scratched, thin metal film and a plastic film according to the present invention.

As shown in FIG. 14, an alternate laminate of pluralities of composite films 1e each having a linearly-scratched, thin metal film and a plastic film and pluralities of dielectric layers 16 may be combined with an electromagnetic wave reflector 15. The electromagnetic wave reflector 15 is preferably arranged at the center of the laminate. In this case, the composite films 1e each having a linearly-scratched, thin metal film and a plastic film are preferably laminated with alternately different crossing angles θs of linear scratches.

The present invention will be explained in more detail referring to Examples below without intention of restricting it thereto.

Example 1

Figure 15:
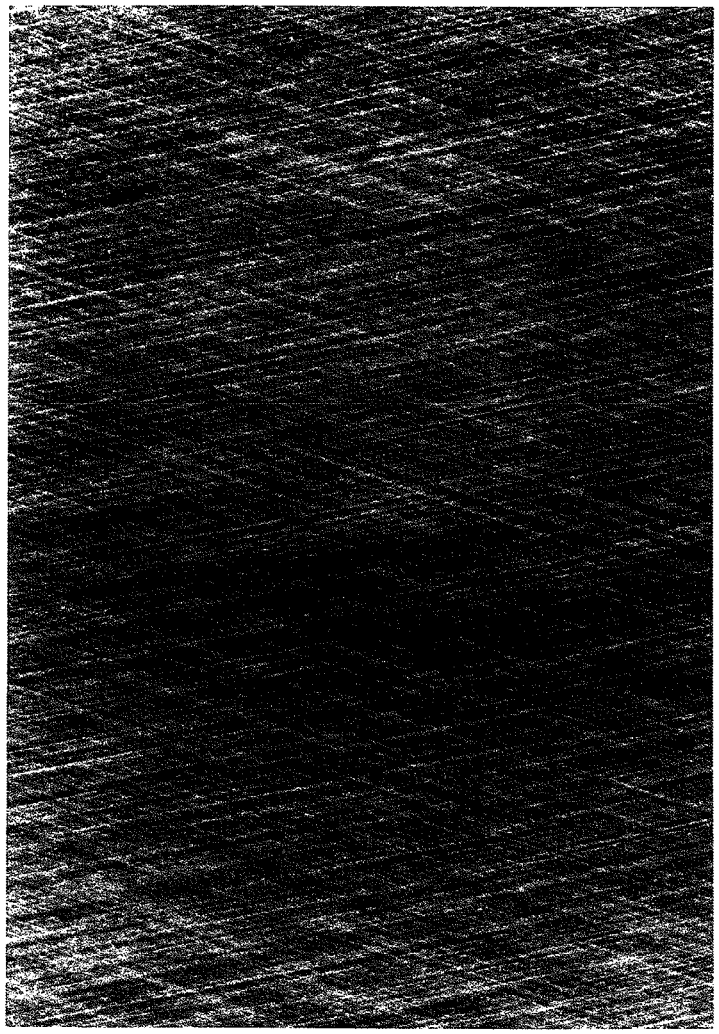
FIG. 15 is an optical photomicrograph (30 times) of linear scratches on the thin metal film of the composite film of Example 1 having a linearly-scratched, thin metal film and a plastic film.

Using an apparatus having the structure shown in FIG. 6(a) comprising pattern rolls 2a, 2b having electroplated fine diamond particles having a particle size distribution of 50-80 μm, a composite film having a linearly-scratched, thin aluminum film and a plastic film was produced from a composite film having a 0.05-μm-thick, thin aluminum film formed on one surface of a biaxially oriented polyethylene terephthalate (PET) film as thick as 12 μm by a vacuum deposition method. Linear scratches were oriented in two directions as shown in FIG. 1(b). An optical photomicrograph of the composite film having a linearly-scratched, thin aluminum film and a plastic film is shown in FIG. 15.

Optical photomicrographical observation revealed that linear scratches in the composite film of a linearly-scratched, thin aluminum film and a plastic film had the following properties.

Range of widths W 0.5-5 μm,
Average width Wav 2 μm,
Range of intervals I 2-30 μm,
Average interval Iav 20 μm,
Average length Lav 5 mm, and
Acute crossing angle θs 30°.

Figure 16:
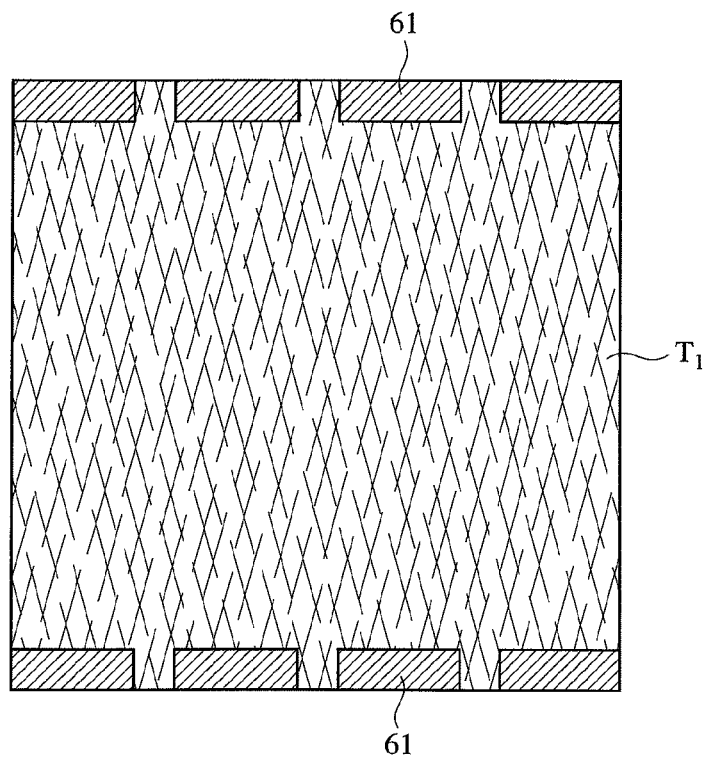
FIG. 16 is a plan view showing surface-resistance-measuring electrodes disposed on a test piece of the composite film having a linearly-scratched, thin metal film and a plastic film.

As shown in FIG. 16, four pairs of copper electrodes (3 cm×1 cm) 61, 61 were arranged on opposing ends of a test piece $T_1$ (28 cm×28 cm) of the composite film having a linearly-scratched, thin aluminum film and a plastic film, to measure resistance therebetween by a DC two-terminal method. The surface resistance of the composite film having a linearly-scratched, thin aluminum film and a plastic film determined from its average resistance was 377 Ω/square.

The composite film having a linearly-scratched, thin aluminum film and a plastic film was bonded to one surface of a foamed polyurethane plate (28 cm×28 cm×2 cm), and an aluminum plate (28 cm×28 cm×1 mm) was bonded to the other surface of the foamed polyurethane plate, to form a test piece $T_2$ of the composite electromagnetic wave absorber shown in FIG. 13.

Figure 17:
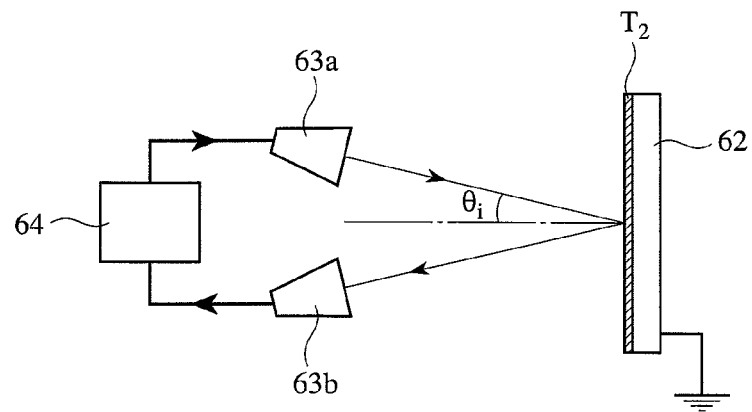
FIG. 17 is a plan view showing an apparatus for evaluating the electromagnetic wave absorbability of an electromagnetic wave absorber.
Figure 18:
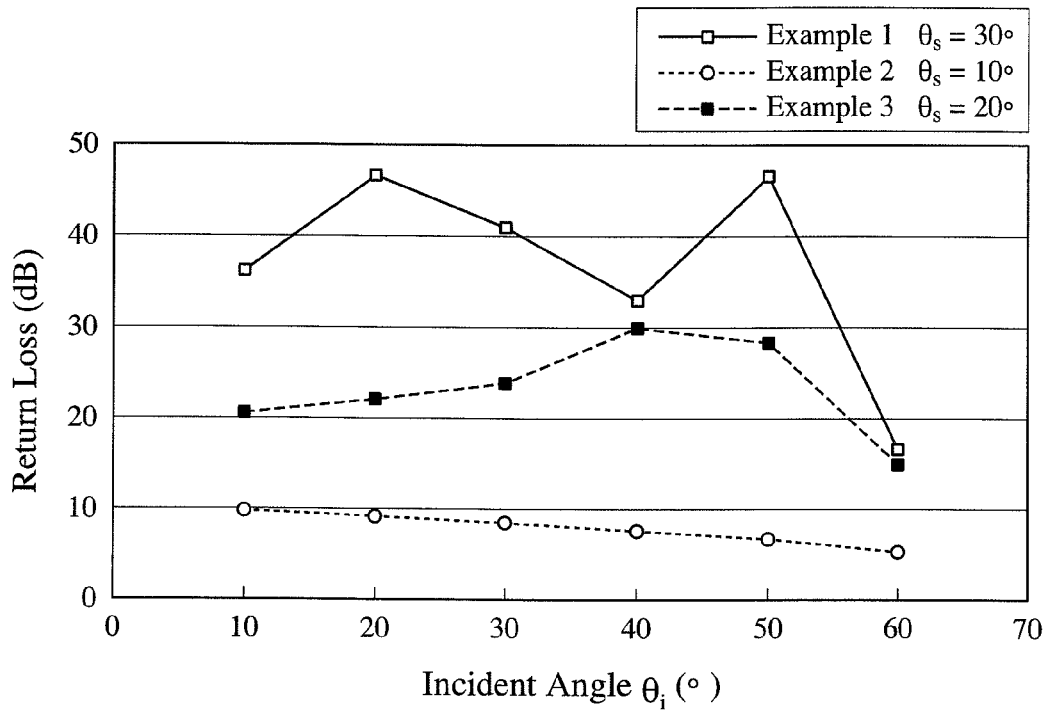
FIG. 18 is a graph showing the relation between the electromagnetic wave incident angle and the return loss in the composite electromagnetic wave absorbers of Examples 1-3.

Using the apparatus shown in FIG. 17, which comprised a grounded dielectric holder 62, a transmitting antenna 63a and a receiving antenna 63b distant from the holder 62 by 100 cm, and a network analyzer 64 connected to the antennas 63a, 63b, the electromagnetic wave absorbability of the composite electromagnetic wave absorber was evaluated by the following method. First, electromagnetic waves (circularly polarized electromagnetic waves) with frequencies changing from 1 GHz to 7 GHz at intervals of 0.25 GHz and incident angles θi changing from 10° to 60° at intervals of 10° were irradiated from the antenna 63a to an aluminum plate (28 cm×28 cm×2 mm) fixed to the holder 62, and reflected waves were received by the antenna 63b, so that reflected electric power was measured by the network analyzer 64. With the thin aluminum film on the side of the antennas 63a, 63b, the test piece $T_2$ was fixed to the holder 62 such that the direction of an acute crossing angle of linear scratches was horizontal, to measure reflected electric power in the same manner as above. Assuming that the reflected electric power measured using the aluminum plate was equal to incident electric power, a reflection coefficient (reflected electric power/incident electric power) RC was determined, and return loss RL (dB) was determined by RL (dB)=20 log(1/RC). The return loss RL at each incident angle θi was plotted at 3.5 GHz. The results are shown in FIG. 18.

Examples 2-9

Figure 19:
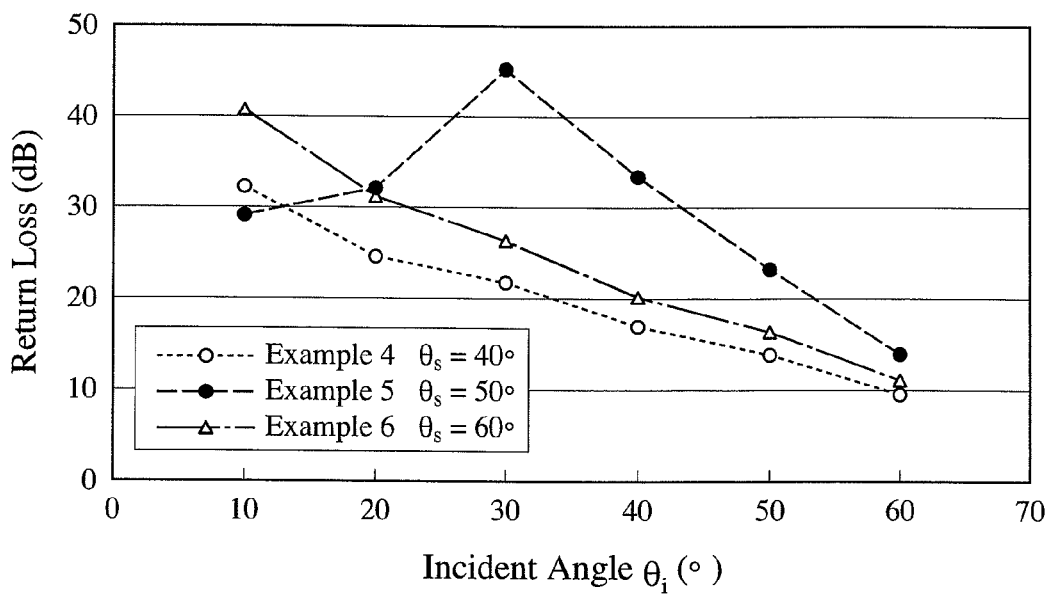
FIG. 19 is a graph showing the relation between the electromagnetic wave incident angle and the return loss in the composite electromagnetic wave absorbers of Examples 4-6.
Figure 20:
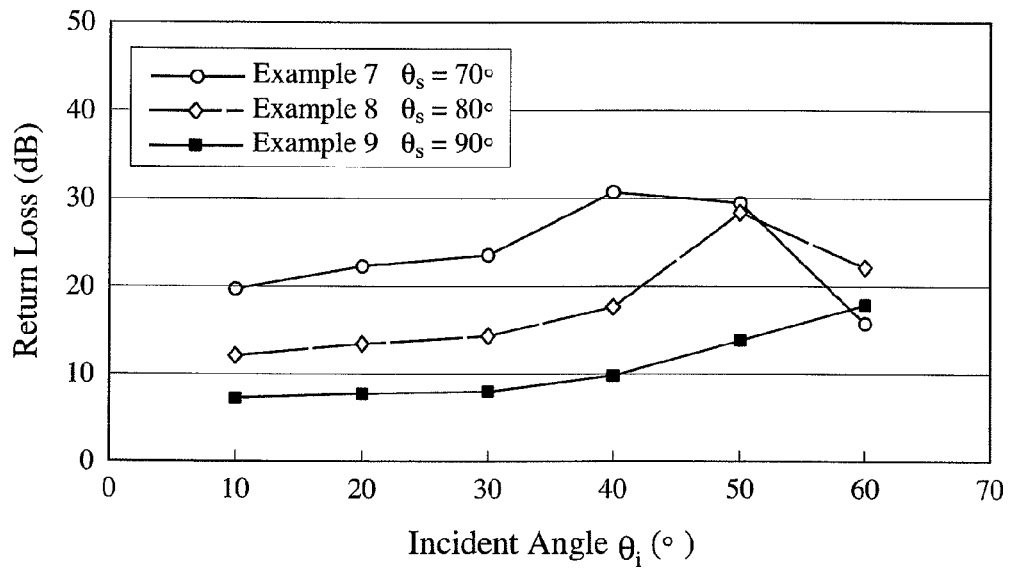
FIG. 20 is a graph showing the relation between the electromagnetic wave incident angle and the return loss in the composite electromagnetic wave absorbers of Examples 7-9.

Composite films each having a linearly-scratched, thin aluminum film and a plastic film were produced, and their electromagnetic wave absorbabilities were evaluated, in the same manner as in Example 1 except for changing the crossing angles θs of linear scratches to 10°, 20°, 40°, 50°, 60°, 70°, 80° and 90°, respectively. The results are shown in FIGS. 18-20. As is clear from FIGS. 18-20, all of the composite electromagnetic wave absorbers of Examples 1-9 had absorbability of 5 dB or more to electromagnetic waves of 3.5 GHz. Particularly the composite electromagnetic wave absorbers of Examples 1 and 3-8 with the crossing angles θs of linear scratches of 20-80° had absorbability of 10 dB or more. Among them, the composite electromagnetic wave absorber of Example 1 having a crossing angle θs of 30° had absorbability of 30 dB or more to electromagnetic waves having incident angles θi of 10-50°.

Example 10

A test piece $T_2$ (21 cm×29.7 cm) of a composite film having a linearly-scratched, thin aluminum film and a plastic film with the crossing angle θs of linear scratches of 40°, the direction of an acute crossing angle of linear scratches being in alignment with the longitudinal direction, was produced in the same manner as in Example 1, and its electromagnetic wave absorbability was evaluated by the following method using the apparatus shown in FIG. 17. First, an aluminum plate (vertical 21 cm, horizontal 29.7 cm, and thickness 2 mm) attached to the holder 62 was irradiated with each of TE and TM waves changing from 1 GHz to 4 GHz from the antenna 63a with an interval of 0.25 GHz at an incident angle θi changing from 10° to 60° with an interval of 10°, and reflected waves were received by the antenna 63b to measure its electric power by a network analyzer 64. The test piece $T_2$ was then attached to the holder 62 such that the direction of an acute crossing angle of linear scratches was horizontal as shown in FIG. 1(b), and the reflected electric power was also measured. With respect to each of the TE and TM waves, return loss RL (dB) was determined from the reflected electric power in the same manner as in Example 1. A peak absorbance (dB) at each incident angle θi and a frequency at which the peak absorbance (peak frequency, GHz) was obtained were plotted in FIG. 21.

The electromagnetic wave absorbability of the test piece $T_2$ was evaluated in the same manner as above except for attaching the test piece $T_2$ to the holder 62 such that the direction of an acute crossing angle of linear scratches was vertical. The results are shown in FIG. 22.

Figure 21:
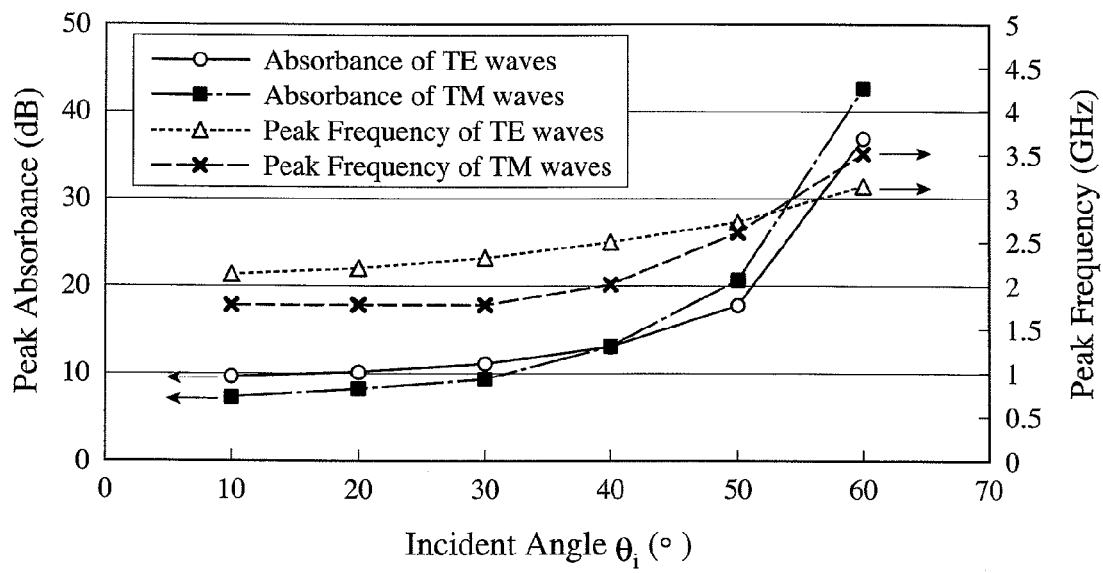
FIG. 21 is a graph showing the relation between the electromagnetic wave incident angle and the peak absorbance and the peak frequency, when measured with the composite film having a linearly-scratched, thin metal film and a plastic film arranged such that the direction of an acute crossing angle of linear scratches is horizontal in Example 10.
Figure 22:
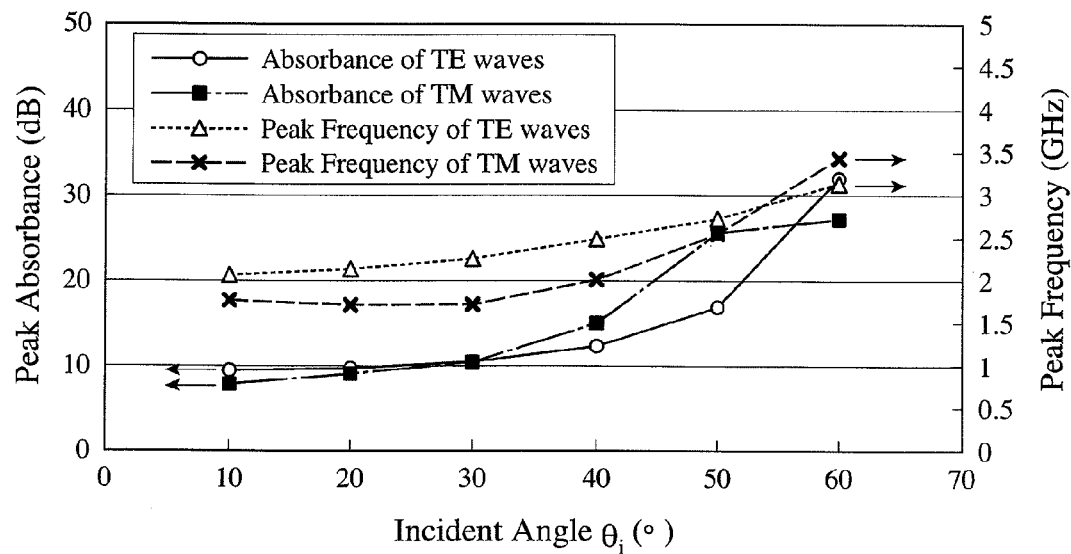
FIG. 22 is a graph showing the relation between the electromagnetic wave incident angle and the peak absorbance and the peak frequency, when measured with the composite film having a linearly-scratched, thin metal film and a plastic film arranged such that the direction of an acute crossing angle of linear scratches is vertical in Example 10.

As is clear from FIGS. 21 and 22, the composite film of Example 10 having a linearly-scratched, thin aluminum film and a plastic film had peak absorbance of 5 dB or more to any of TE and TM waves at incident angles θi of 10-60°, particularly peak absorbance of 10 dB or more at incident angles θi of 40-60°.

Example 11

Using an apparatus having the structure shown in FIG. 9 comprising pattern rolls 2a-2d having electroplated fine diamond particles having a particle size distribution of 50-80 μm, linear scratches oriented in four directions with all crossing angles of 45° as shown in FIG. 2(b) were formed on a composite film having a thin aluminum film having a thickness of 0.05 µm. A test piece (60 cm×60 cm) of the composite film having a linearly-scratched, thin aluminum film and a plastic film had surface resistance of 377 Ω/square. Optical photomicrographical observation revealed that linear scratches in the composite film of a linearly-scratched, thin aluminum film and a plastic film had the following properties.

Range of widths W 0.5-5 µm,
Average width Wav 2 µm,
Range of intervals I 2-10 µm,
Average interval Iav 5 µm, and
Average length Lav 5 mm.

Figure 23:
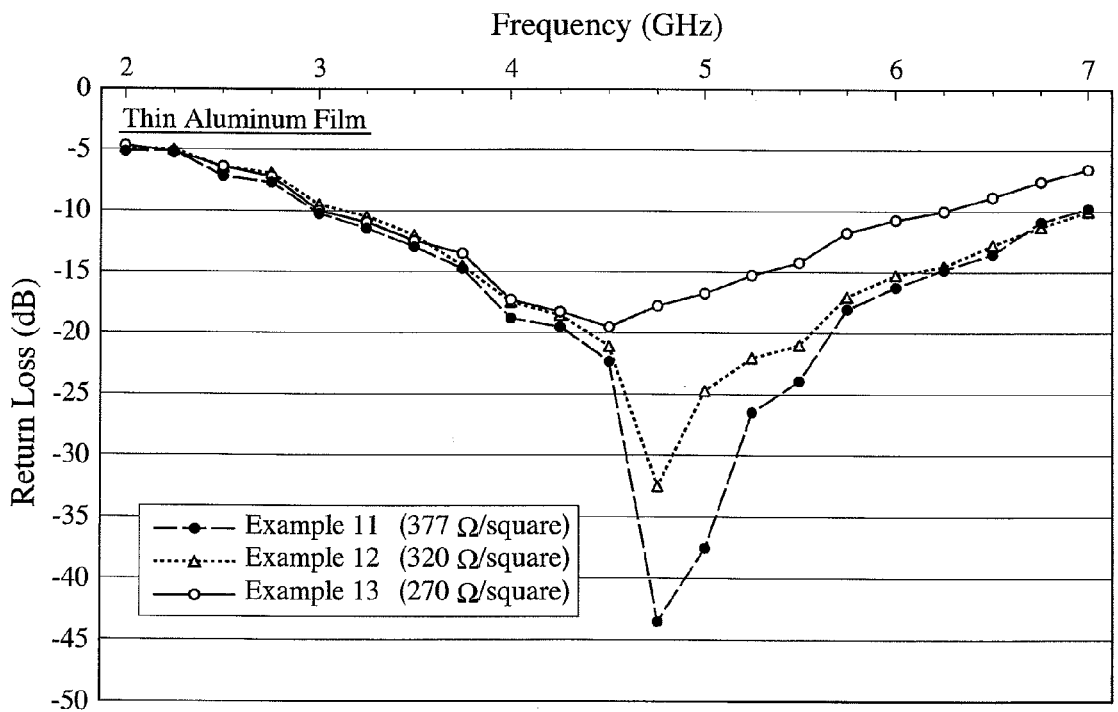
FIG. 23 is a graph showing the relation between the frequency and the return loss in the composite electromagnetic wave absorbers of Examples 11-13.

A composite film having a linearly-scratched, thin aluminum film and a plastic film was attached to one side of a foamed polystyrene plate (60 cm×60 cm×15 mm), with an aluminum plate (60 cm×60 cm×5 mm) attached to the other side, to form a composite electromagnetic wave absorber shown in FIG. 13. Using an aluminum plate (60 cm×60 cm×5 mm), the reflected electric power was measured in the same manner as in Example 1 except for using electromagnetic waves of 2-7 GHz at incident angles θi of 7°. The above composite electromagnetic wave absorber was then attached to the holder 62 with the linearly-scratched, thin aluminum film on the side of the antennas 63a, 63b, to measure the reflected electric power in the same manner as above. The return loss RL (dB) at frequencies of 2-7 GHz was determined from the reflection coefficient RC obtained by the measured reflected electric power, by RL (dB)=−20 log(1/RC). The results are shown in FIG. 23.

Examples 12 And 13

Composite films each having a linearly-scratched, thin aluminum film and a plastic film, which had surface resistance of 320 Ω/square and 270 Ω/square, respectively, were produced in the same manner as in Example 11, and composite electromagnetic wave absorbers were produced using them in the same manner as in Example 11 to evaluate their electromagnetic wave absorbabilities. The results are shown in FIG. 23.

Example 14

A composite film having a linearly-scratched, thin nickel film and a plastic film, which had linear scratches oriented in two directions as shown in FIG. 1(b) to have surface resistance of 380 Ω/square, was produced in the same manner as in Example 1, except for using a composite film having a thin nickel film as thick as 0.03 µm formed by a vacuum deposition method on one surface of a biaxially oriented PET film having a thickness of 16 µm. Optical photomicrographical observation revealed that linear scratches in the composite film of a linearly-scratched, thin nickel film and a plastic film had the following properties.

Range of widths W 0.5-5 µm,
Average width Wav 2 µm,
Range of intervals I 2-10 µm,
Average interval Iav 5 µm, and
Average length Lav 5 mm.

A composite electromagnetic wave absorber was produced in the same manner as in Example 11 except for using the composite film of a linearly-scratched, thin nickel film and a plastic film, and its electromagnetic wave absorbability was evaluated. The results are shown in FIG. 24.

Figure 24:
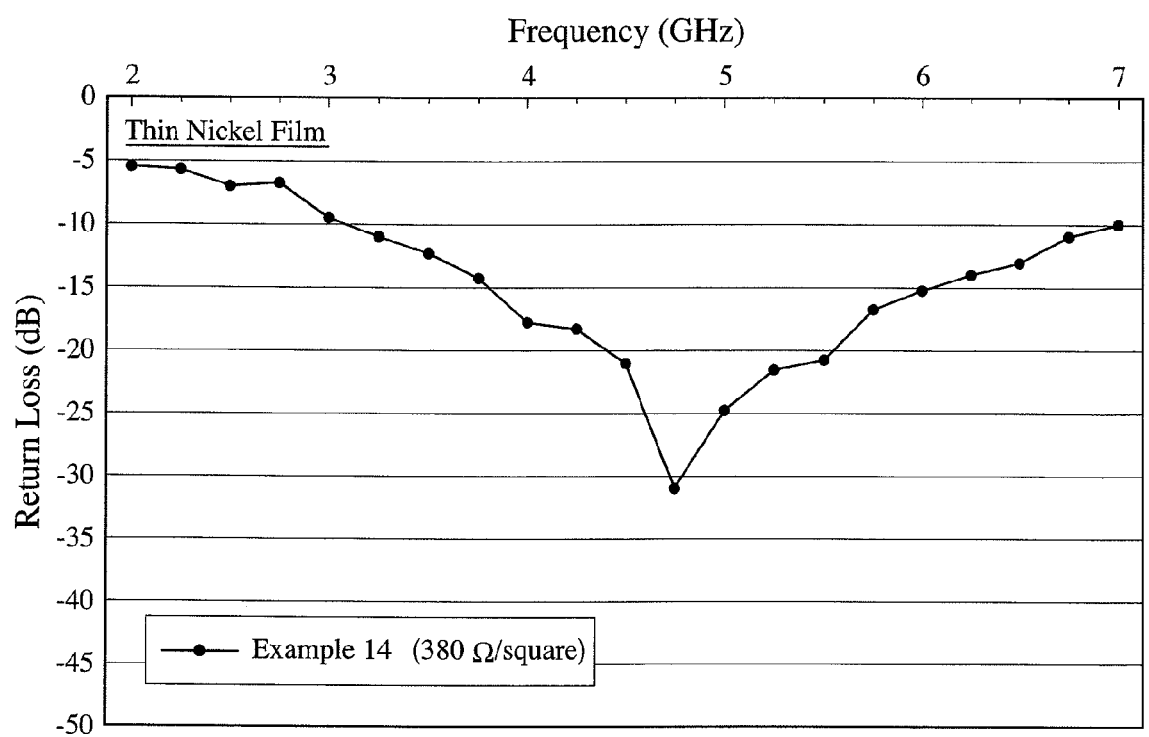
FIG. 24 is a graph showing the relation between the frequency and the return loss in the composite electromagnetic wave absorber of Example 14.

As is clear from FIGS. 23 and 24, all of the composite electromagnetic wave absorbers of Examples 11-14 had absorbability of 5 dB or more to electromagnetic waves in 2-7 GHz. Particularly the composite electromagnetic wave absorbers of Examples 11-13 had absorbability of 10 dB or more to electromagnetic waves in 3-6 GHz. Also, the composite electromagnetic wave absorber of Example 11 had the maximum absorbance of 43 dB at a frequency of 4.75 GHz, the composite electromagnetic wave absorber of Example 12 had the maximum absorbance of 32.5 dB at a frequency of 4.75 GHz, the composite electromagnetic wave absorber of Example 13 had the maximum absorbance of 19.5 dB at a frequency of 4.5 GHz, and the composite electromagnetic wave absorber of Example 14 had the maximum absorbance of 31 dB at a frequency of 4.75 GHz.

EFFECTS OF THE INVENTION

Because the composite film having a linearly-scratched, thin metal film and a plastic film according to the present invention has linear scratches in plural directions on the thin metal film, it has not only excellent absorbability to electromagnetic waves in various frequencies, but also low anisotropy in electromagnetic wave absorbability. Combining pluralities of the composite films each having a linearly-scratched, thin metal film and a plastic film according to the present invention directly or via dielectric layers results in improved electromagnetic wave absorbability. Particularly when the dielectric layer is air, it has not only excellent electromagnetic wave absorbability but also excellent heat and sound insulation, suitable for building materials, etc.

A combination of the composite film having a linearly-scratched, thin metal film and a plastic film according to the present invention with an electromagnetic wave reflector via a dielectric layer provides extremely high electromagnetic wave absorbability, because waves reflected from both cancel each other by interference.

The composite film having a linearly-scratched, thin metal film and a plastic film according to the present invention having such features is suitably used in electronic appliances and communications apparatuses such as cell phones, personal computers and television sets, RFID (radio frequency identification) systems using IC tags, non-contact IC cards, etc., wireless LAN systems, automatic toll collecting systems on toll roads, inner walls of buildings, etc.

Because the apparatus of the present invention comprises at least two pattern rolls arranged in different directions, it can continuously form large numbers of substantially parallel, intermittent, linear scratches in plural directions on the thin metal film, thereby inexpensively producing an electromagnetic-wave-absorbing film with reduced anisotropy in electromagnetic wave absorbability.

What is claimed is:

1. A composite film having a linearly-scratched, thin metal film and a plastic film having the reduced anisotropy of electromagnetic wave absorbability, which has a plastic film, and a single- or multi-layer, thin metal film formed on at least one surface of said plastic film, said thin metal film being provided with large numbers of substantially parallel, intermittent, linear scratches with irregular widths and irregular intervals in plural directions with crossing angles of 10-90°, said linear scratches being formed by pattern rolls each having large numbers of fine, high-hardness particles on the surface.

2. The composite film having a linearly-scratched, thin metal film and a plastic film according to claim 1, wherein said linear scratches have widths, 90% or more of which are in a range of 0.1-1,000 µm, and an average width of 1-100 µm, and intervals in a range from 0.1 µm to 5 mm, and an average interval of 1-100 µm.

3. The composite film having a linearly-scratched, thin metal film and a plastic film according to claim 1, wherein said thin metal film is made of aluminum, copper, nickel or their alloys.

* * * * *